United States Patent
Yamamoto et al.

[11] Patent Number: 5,909,407
[45] Date of Patent: Jun. 1, 1999

[54] WORD LINE MULTI-SELECTION CIRCUIT FOR A MEMORY DEVICE

[75] Inventors: Yasuhiro Yamamoto; Takaaki Furuyama; Hidenori Nomura, all of Kasugai, Japan

[73] Assignee: Fujitsu Limited, Kanagawa, Japan

[21] Appl. No.: 09/030,269

[22] Filed: Feb. 25, 1998

[30] Foreign Application Priority Data

Aug. 21, 1997 [JP] Japan ................................ 9-225168

[51] Int. Cl.$^6$ ........................................ G11C 8/00
[52] U.S. Cl. ........................ 365/230.06; 365/230.01; 365/189.05
[58] Field of Search ................ 365/189.05, 189.01, 365/189.12, 230.06, 230.01

[56] References Cited

U.S. PATENT DOCUMENTS 4,638,466  1/1987  Fukumoto ........................ 365/94
5,596,543  1/1997  Sakui et al. ..................... 365/233

*Primary Examiner*—Son Mai
*Attorney, Agent, or Firm*—Nikaido Marmelstein Murray & Oram, LLP

[57] ABSTRACT

A semiconductor memory device, such as a DRAM, includes a word line multi-selection circuit. A row decoder generates a word line selecting signal for selecting a read-out word line for use in the current cycle to read information from a selected memory cell. The word line selecting signal is also used to select a write-back word line which was used in the previous cycle to read cell information and is used in the current cycle to write back cell information. The word line multi-selection circuit includes a register for temporarily storing the cell information read from the selected memory cell and also for providing, in the current cycle, information read in the previous cycle in order to perform the write-back operation.

27 Claims, 19 Drawing Sheets

WORD LINE MULTI-SELECTION CIRCUIT FOR A MEMORY DEVICE

BACKGROUND OF THE INVENTION

The present invention relates to a semiconductor memory device, and particularly to a DRAM for performing high-speed read and write operations.

Electronic apparatus using semiconductor devices, such as workstations and personal computers, have made great strides in increasing their operational speed in recent years. Such electronic apparatus typically includes DRAM type memory devices and attain increased operational speed based on the EDO (Extended Data Out) DRAMs, page mode, etc. However, at present, DRAMs cannot operate as fast as an MPU which is another major component part of such electronic apparatus. Accordingly, the MPU operates slower, thereby decreasing performance of the system as a whole. Therefore, it would be desirable to increase the speed of DRAMs.

An example of the sequence of operation of the conventional DRAM will be explained with reference to FIG. 1. When the control signal /RAS goes low, a row address signal R1 is provided from an external device, and a word line WL1 which is selected by the row address signal R1 is activated. Each word line is raised to a step-up voltage of 5 V which is higher than the power voltage of 3 V, for example, in order to read cell information from the selected memory cell efficiently and quickly or write cell information to the selected memory cell firmly and quickly. Cell information is read from the memory cell connected to the selected word line WL1 onto one of bit line pairs BL and /BL, creating a small voltage difference emerging between the bit line pair BL and /BL.

Subsequently, a sense amplifier activation signal LE is provided to the sense amplifier that is connected to the bit line pairs BL and /BL so that the small voltage difference between the bit line pair BL and /BL is amplified, and the retrieved cell information is written back to the memory cell.

When another external control signal /CAS goes low, a bit line pair BL and /BL are selected by an external column address signal, causing the sense amplifier of the selected bit line pair BL and /BL to place its output signal as cell information on the data bus.

Subsequently, when the control signals /RAS and /CAS go high, the word line selecting operation ends, causing the word line WL1 to fall to the low level. In addition, the sense amplifier is inactivated and the bit line pair selecting operation ends, causing the bit line pair BL and /BL, from which cell information has been read, to be reset to an intermediate voltage. Thus, a one cycle read operation is completed.

Subsequently, when the control signal /RAS goes low again, another row address signal R2 is provided, causing another word line WL2 to rise to the high level, and the read operation proceeds as explained above.

The read cycle includes a certain wait time t1 after the control signal /RAS has gone high at the end of the previous read operation until the control signal /RAS goes low at the beginning of the next read operation. This wait time t1 is provided to allow the high-level word line WL1 in the previous cycle to fall enough before the word line WL2 selected in the next cycle is activated, thereby preventing a double selection of the word lines WL1 and WL2. The wait time t1 needs to be as long as a ⅓ cycle time of read operation, and therefore reduction of the wait time t1 contributes significantly to the speed-up of reading. However, it is difficult to reduce the wait time t1 without altering the basic design.

Attempting to increase the output power of the word line drive circuit so as to pull down word lines quickly to the low level invites read errors caused by increased power noise, or even much slower pull-down of word lines due to a lack of output current of the voltage step-up power circuit.

Another attempt of lowering the high-level voltage of word lines to speed up the pull-down of the word lines results in a reduced charge to the memory cells, which necessitates a shorter refresh period for cell information and increased power consumption.

An object of the present invention is to provide a semiconductor memory device capable of speeding up the read-out of cell information and having low power consumption.

SUMMARY OF THE INVENTION

Briefly stated, the present invention provides a semiconductor memory device capable of reading cell information from a memory cell in a memory cell array associated with a selected one of a plurality of word lines within one cycle of an activated control signal. The device includes: a row decoder, responsive to the activated control signal and generating a word line selecting signal for selecting a read-out word line, the read-out word line used in a current cycle to read the cell information in accordance with a row address signal and selecting a write-back word line, which has been used in a previous cycle to read cell information and used in the current cycle to write back cell information; a register receiving the cell information read from the memory cell associated with the word line selecting signal and temporarily storing the read cell information, the register further writing, in the current cycle, the read cell information, which was stored in the register in the previous cycle, back to the memory cell associated with the selected write-back word line; and a sense amplifier circuit receiving the read cell information from the register and providing the read cell information as read-out data therefrom.

The present invention further provides a memory device including: a memory cell array including a plurality of memory cells containing information; a row decoder for generating a word line selecting signal for selecting a read-out word line, the read-out word line used in a current cycle to read the cell information from a selected one of the plurality of memory cells, and for selecting a write-back word line, the write-back word line having been used in a previous cycle to read cell information from a previous selected one of the plurality of memory cells, to write-back cell information back into the previously selected memory cell; a word line multi-selection circuit receiving the word line selecting signal and generating a read-out word line selection signal selecting the read-out word line and a write-back word line selection signal selecting the write-back word line; and a register receiving and storing the cell information read in the current cycle and writing back to the memory cell read in the previous cycle, the cell information read in the previous cycle, as specified by the write-back word line.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings.

DESCRIPTION OF THE PREFERRED EMBODIMENTS

Figure 1:
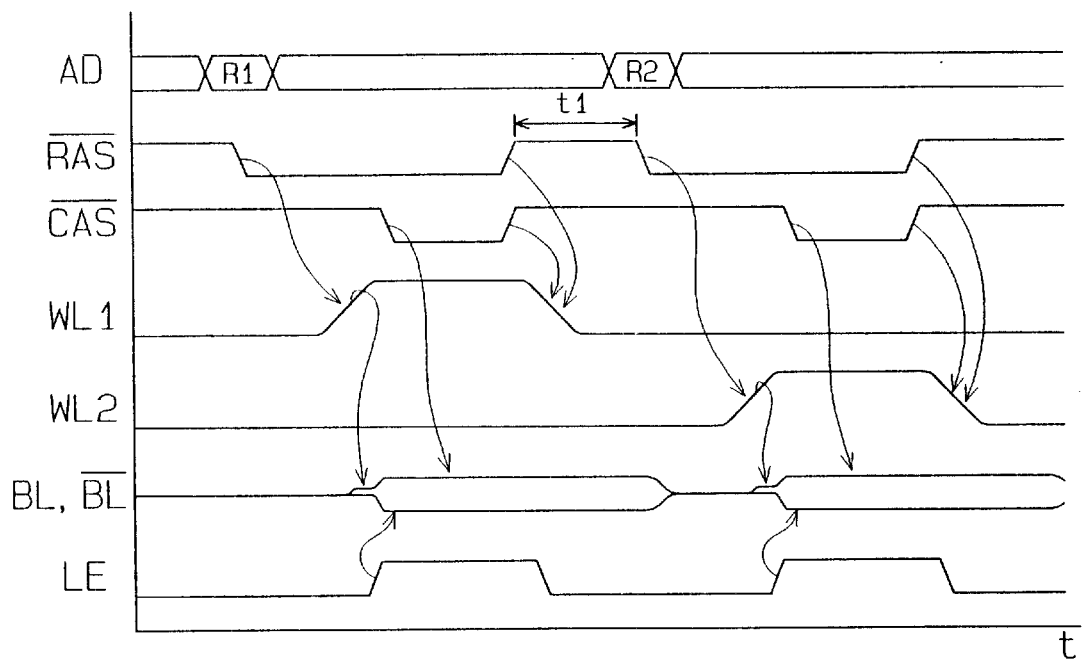
FIG. 1 is a timing chart showing the sequence of a read operation of a conventional DRAM.
Figure 2:
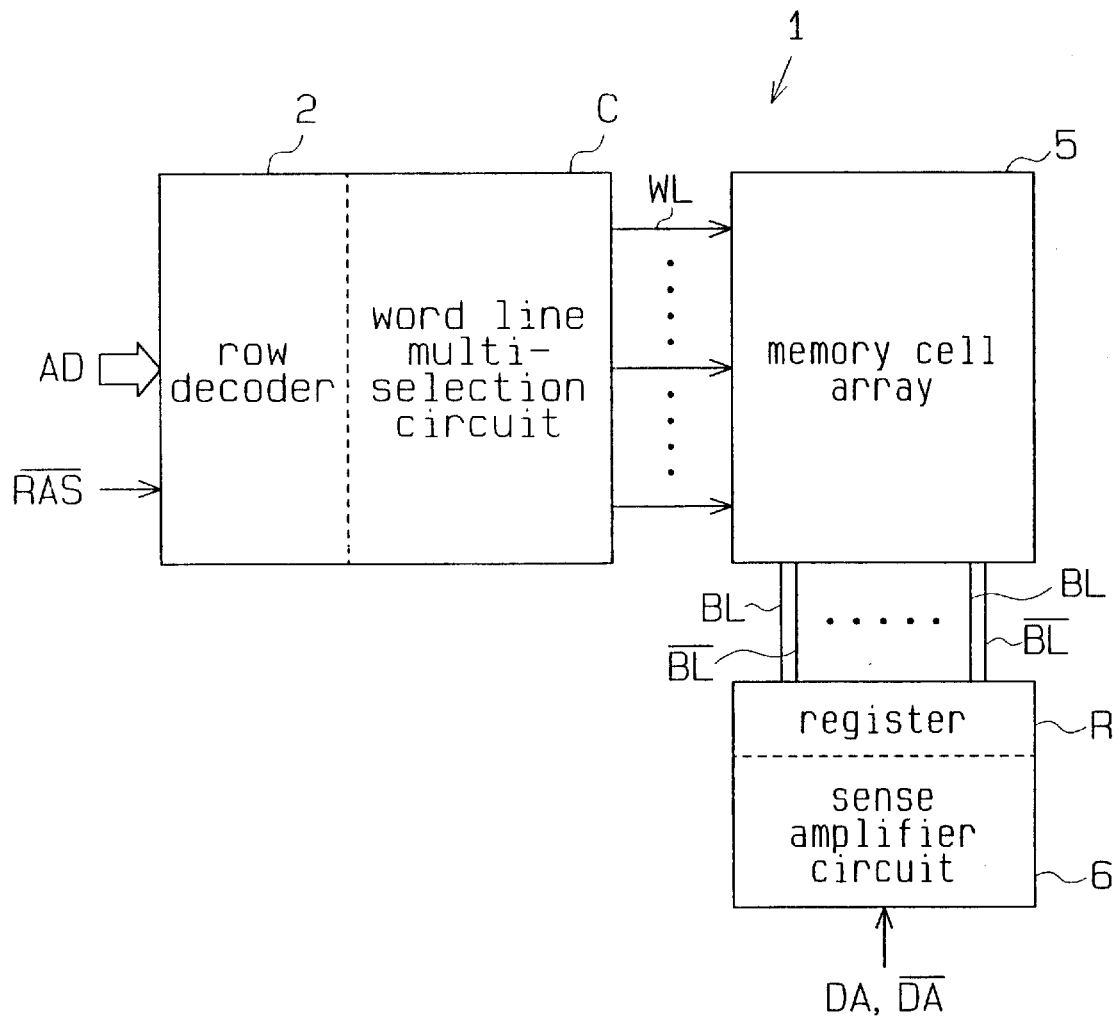
FIG. 2 is a block diagram of a semiconductor memory device of the present invention.

FIG. 2 shows the overall arrangement of the inventive semiconductor memory device 1 according to the present invention. The memory device 1 comprises a row decoder 2, a memory cell array 5, and a sense amplifier circuit 6. The row decoder 2 selects word lines WL of the memory cell array 5 in accordance with an address signal AD in response to the transition of a control signal /RAS from an inactive level to an active level. The sense amplifier circuit 6 latches cell information which has been read onto bit line pairs BL and /BL from the memory cells of the memory cell array 5 selected by the word lines WL, and outputs the cell information as read-out data DA and /DA. Cell information is read from the memory cells connected to the word lines WL in one cycle of the control signal /RAS.

The row decoder 2 has an associated word line multiple selection (multi-selection) circuit C which operates in response to the transition of the control signal /RAS to the active level to select read-out word lines WL in accordance with the address signal AD entered in the current cycle and also select, for write-back word lines, the word lines WL used for reading in the previous cycle.

The sense amplifier circuit 6 has an associated register R which latches the cell information read onto the bit lines from the memory cells selected by the read-out word lines and delivers the cell information to the sense amplifier circuit 6, and also writes the cell information, latched in the previous cycle, back to the memory cells selected by the write-back word lines in the previous cycle.

Figure 3:
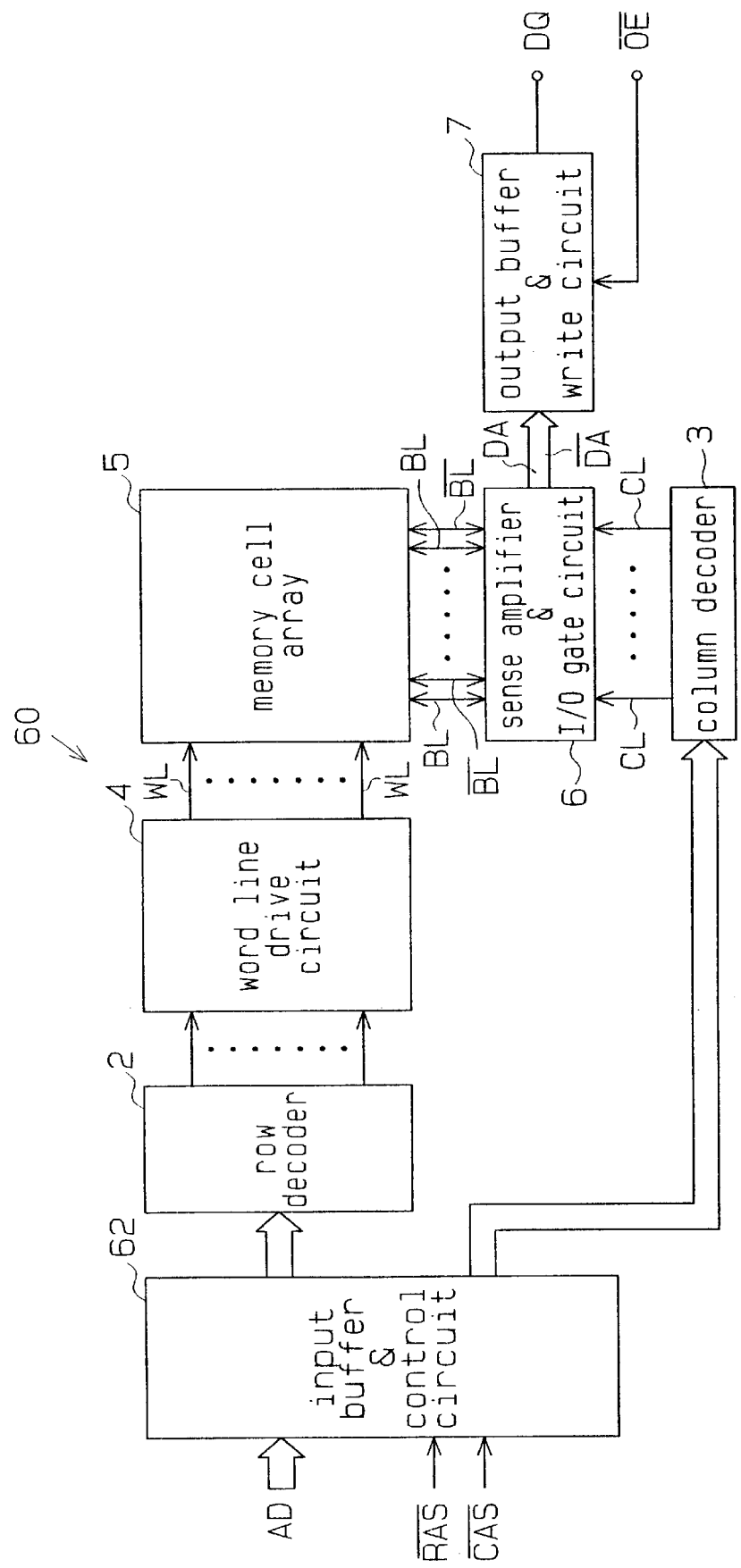
FIG. 3 is a block diagram of a conventional DRAM.

FIG. 3 shows in brief the basic arrangement of a conventional DRAM 60. The address signal AD from an external device (not shown) is introduced to an input buffer & control circuit 62. The input buffer & control circuit 62 provides the address signal AD to the row decoder 2 and a column decoder 3. The control signals /RAS and /CAS are introduced to the input buffer & control circuit 62, which produces an output signal therefrom to activate the row decoder 2 and column decoder 3.

The row decoder 2 produces word line selecting signals from the address signal AD, and provides the word line selecting signals to a word line drive circuit 4. The word line drive circuit 4 selects and sets one of word lines WL of the memory cell array 5 to the high level in accordance with the word line selecting signals. The column decoder 3 produces column selecting signals CL from the address signal AD, and provides the column selecting signals CL to the sense amplifier circuit 6. One of the memory cells in the memory cell array 5 is selected by a pair of bit lines BL and /BL, which are activated by the column selecting signal CL, and a word line WL which is activated by the word line drive circuit 4.

The sense amplifier circuit 6 is connected to an output buffer & write circuit 7, which is connected to an input/output terminal DQ. The output buffer & write circuit 7 receives an output control signal /OE from the external device. The output control signal /OE causes the output buffer & write circuit 7 to operate in read mode or write mode. In read mode, cell information read from the selected memory cell is fed to the output buffer & write circuit 7 by way of the sense amplifier circuit 6, and the output buffer & write circuit 7 outputs output data on the input/output terminal DQ. In write mode, input data received on the input/output terminal DQ is written into the selected memory cell by way of the output buffer & write circuit 7 and the sense amplifier circuit 6.

The basic arrangement of the conventional DRAM shown in FIG. 3 is modified according to the present invention, which includes a novel arrangement of the row decoder 2 and the sense amplifier circuit 6.

First Embodiment

1. First word line selection scheme

Figure 4:
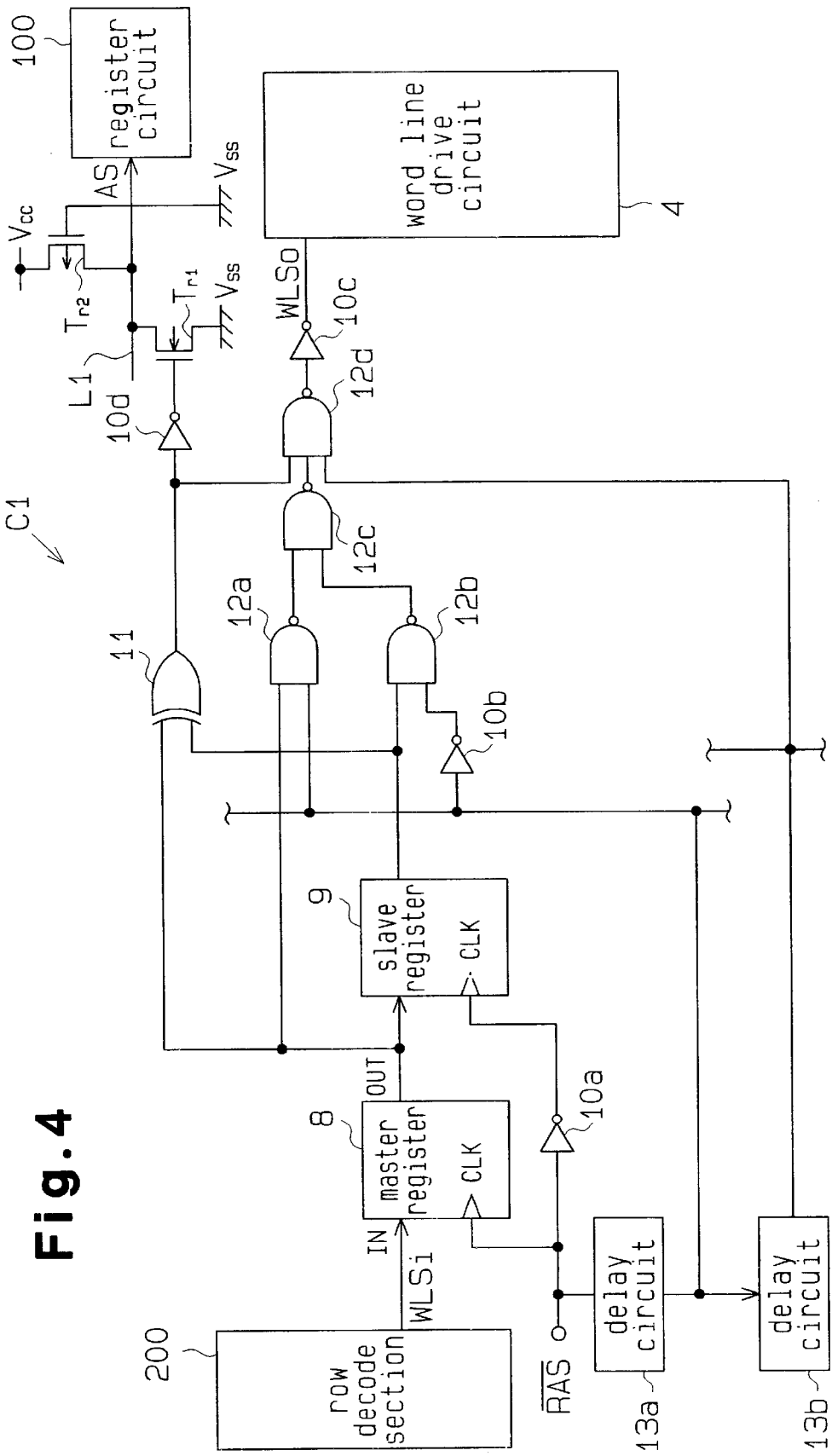
FIG. 4 is a schematic diagram of a word line multi-selection circuit according to a first embodiment of the present invention.

FIG. 4 shows the row decoder 2 which includes a row decode section 200 and a word line multi-selection circuit C1. The word line multi-selection circuit C1 is connected to the word line drive circuit 4 and is provided individually for each of a plurality of word line selecting signals WLSi produced by the row decode section 200 (i.e., the number of circuits C1 is equal in number to the number of the word lines). A pair of Delay circuits 13a and 13b are connected to each of the word line multi-selection circuits C1.

The word line selecting signal WLSi is provided as an input signal IN to a master register 8, which also receives the control signal /RAS as a clock signal CLK. The master register 8 receives the input signal IN and provides an output signal OUT when the clock signal CLK (the control signal /RAS) is low, and latches the input signal IN in response to the clock signal CLK high.

The output signal OUT of the master register 8 is provided as an input signal to a slave register 9, which also receives as its clock signal CLK an inverted version of the control signal /RAS produced by an inverter 10a. The slave register 9 provides its output signal when the clock signal CLK is low and latches the input signal in response to clock signal CLK high.

The output of the master register 8 and the slave register 9 are input to an exclusive-OR gate 11. The XOR gate 11 generates a low-level output signal when the output signals of the registers 8 and 9 are both high or low. Otherwise, the XOR gate 11 generates a high-level output signal.

The output signal OUT of the master register 8 is also provided to one input terminal of a 2 input NAND gate 12a, which receives on its another input terminal the control signal /RAS delayed by a delay circuit 13a. The output signal of the slave register 9 is also provided to one input terminal of a NAND gate 12b, which receives on another input terminal an inverted output signal of the delay circuit 13a inverted by an inverter 10b.

The delay circuit 13b receives the output signal of the delay circuit 13a and produces another delayed control signal therefrom. The NAND gates 12a–12c form a multiplexer.

The NAND gates 12a and 12b provide output signals to a NAND gate 12c, which in turn provides an output signal to a NAND gate 12d. The NAND gate 12d also receives the output signal of the exclusive-OR gate 11 and the output of the second delay circuit 13b.

The NAND gate 12d provides an output signal to the word line drive circuit 4 through an inverter 10c as a word line selecting signal WLSo. An activated word line selecting signal WLSO causes the word line drive circuit 4 to raise the corresponding word line to a high level.

The exclusive-OR gate 11 generates an output signal to the gate of an n-channel MOS transistor Tr1 through an inverter 10d having its source connected to the low power voltage (ground) Vss and its drain connected to a signal line L1. The signal line L1 is common to all word line multi-selection circuits C1. The signal line L1 is for an address coincidence signal AS, and is connected to the power voltage Vcc through a p-channel MOS transistor Tr2, which is much smaller in size than the MOS transistor Tr1 and is always conductive by being biased on its gate by the low power voltage Vss. Accordingly, conduction of any of the transistors Tr1 of multiple word line multi-selection circuits C1 produces a low-level address coincidence signal AS on the signal line L1. The signal line L1 has high level when all of the transistors Tr1 are off.

Figure 5:
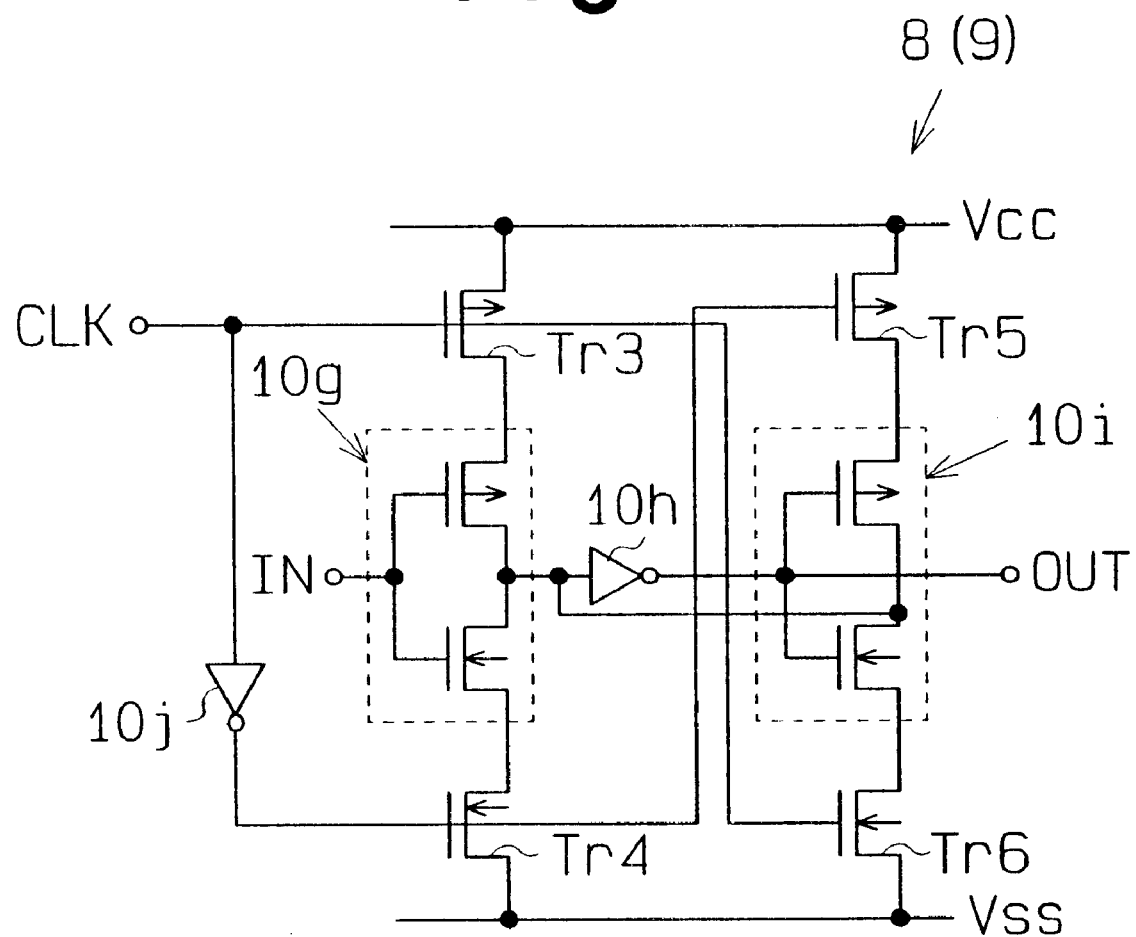
FIG. 5 is a schematic diagram of a register of the word line multi-selection circuit of FIG. 4.

Referring to FIG. 5, a more detailed circuit diagram of a latch circuit used for the master register 8 and slave register 9 is shown. An inverter circuit 10g is supplied with the high power voltage Vcc through a p-channel MOS transistor Tr3 and supplied with the low power voltage Vss through an n-channel MOS transistor Tr4. The inverter circuit 10g receives the input signal IN of the register 8 or 9, and provides an output signal OUT through an inverter 10h to another inverter circuit 10i. The inverter circuit 10i also provides an output signal to the inverter 10h. The inverter circuit 10i is supplied with the high power voltage Vcc through a p-channel MOS transistor Tr5 and supplied with the low power voltage Vss through an n-channel MOS transistor Tr6.

The clock signal CLK is received by transistors Tr3 and Tr6, and also received by transistors Tr4 and Tr5 through an inverter 10j. The inverter circuit 10g has a higher load driving capacity relative to the inverter 10h and inverter circuit 10i. The transistors Tr3 and Tr4 turn on and Tr5 and Tr6 turn off in response to the clock signal CLK low. Consequently, the inverter circuit 10g output is high and the inverter circuit 10i output is low, causing the inverter 10h to produce the output signal OUT which is in-phase with the input signal IN.

Subsequently, in response to the clock signal CLK high, the transistors Tr3 and Tr4 turn off and Tr5 and Tr6 turn on. Consequently, the inverter circuit 10g output goes low and the inverter circuit 10i output goes high, causing the inverter 10h and inverter circuit 10i in unison to receive the output signal OUT.

Referring again to FIG. 4, the row decoder 2 and word line drive circuit 4 having the word line multi-selection circuit C1 operate to retain the selected word line WL1 at the high level only during a predetermined delay time set by the delay circuit 13a since the fall of the control signal /RAS. The row decoder 2 and word line drive circuit 4 further operate, in a next cycle, to raise the word line WL1 to the high level on expiration of a predetermined delay time set by the delay circuit 13a after the falling of the control signal /RAS and to lower the word line WL1 to the low level on expiration of the delay time of the delay circuit 13b.

Specifically, when the control signal /RAS goes low and the word line selecting signal WLSi goes high in accordance with the input address signal AD, the master register 8 receives a high-level word line selecting signal WLSi and outputs a high-level output signal OUT. At this time, the slave register 9 outputs the latched low-level output signal OUT which was provided by the master register 8 in the previous cycle.

These high and low-level output signals OUT of the registers 8 and 9 cause the exclusive-OR gate 11 to output a high-level output signal, and the transistor Tr1 is turned off. The delay circuit 13a continues to output the high-level output signal, causing the NAND gate 12a to output a low-level output signal. The low-level output signal of the slave register 9 causes the NAND gate 12b to output a high-level output signal.

The low and high-level output signals of the NAND gates 12a and 12b respectively, causes the NAND gate 12c to output a high-level output signal. At this time, the delay circuit 13b outputs a high-level output signal. Accordingly, the NAND gate 12d receives three high-level input signals and outputs a low-level output signal, which is inverted by the inverter 10c, such that a high-level word line selecting signal WLSo is produced.

On expiration of a predetermined delay time, the delay circuit 13a output signal goes low, causing the output signal of the NAND gate 12a to go high. The NAND gate 12c now receives two high-level input signals and thus outputs a low-level output signal, causing the output signal of the NAND gate 12d to go high and the word line selecting signal WLSo to go low. Accordingly, the word line selecting signal WLSo is maintained high only during the delay time of the delay circuit 13a, after the control signal /RAS has gone low.

Subsequently, when the control signal /RAS goes high, the master register 8 latches a high-level output signal OUT, and the slave register 9 outputs a high-level output signal in response to receiving a high-level input signal. Accordingly, the exclusive-OR gate 11 receiving two high-level input signals outputs a low-level output signal, causing the NAND gate 12d to continue to output a high-level output signal, and the word line selecting signal WLSo is maintained low.

In the next cycle, when the input word line selecting signal WLSi stays low following the switching of the address signal AD, with the control signal /RAS being low, the master register 8 latches the low-level word line selecting signal WLSi. At this time, the slave register 9 is releasing the high-level output signal OUT of the previous cycle provided by the master register 8.

Consequently, the exclusive-OR gate 11 outputs a high-level output signal, causing the transistor Tr1 to turn off. The delay circuit 13a continues to output the high-level output signal, causing the NAND gate 12a to output a high-level output signal. Since the slave register 9 outputs a high-level output signal OUT and the inverter 10b outputs a low-level output signal, the NAND gate 12b outputs a high-level output signal. Then, the output signal of the NAND gate 12c goes low, causing the output signal of the NAND gate 12d to go high, such that the word line selecting signal WLSo is maintained low.

Subsequently, the output signal of the delay circuit 13a goes low on expiration of its delay time, while the output signal of the master register 8 stays low, causing the output of the NAND gate 12a to remain high. At the same time, the output signal of the inverter 10b goes high, causing the NAND gate 12b to input two high-level input signals and output a low-level output signal. Consequently, the NAND gate 12c outputs a high-level output signal, causing the NAND gate 12d to receive three high-level input signals and output a low-level output signal, such that the word line selecting signal WLSo goes high.

Subsequently, the output signal of the delay circuit 13b goes low, causing the NAND gate 12d output to go high, and the word line selecting signal WLSo to go low. That is, the word line selecting signal WLSo goes low prior to the rising of the control signal /RAS.

In case the word line selecting signal WLSi stays low in both the previous and current cycles, the master register 8 and slave register 9 output low output signals in response to the control signal /RAS. Consequently, the exclusive-OR gate 11 outputs a low-level output signal, causing the NAND gate 12d to output a high-level output signal, and the word line selecting signal WLSo stays low and the word line is not selected. The transistor Tr1 turns on, causing the address coincidence signal AS to go low.

In case the same row address signal is supplied and the word line selecting signal WLSi goes high in the previous and current cycles, the master register 8 and slave register 9 output high output signals in response to the control signal /RAS low. Consequently, the exclusive-OR gate 11 outputs a low-level output signal, causing the NAND gate 12d to output a high-level output signal, so that the word line selecting signal WLSo stays low and the word line is not selected. The transistor Tr1 turns on, causing the address coincidence signal AS to go low.

Figure 6:
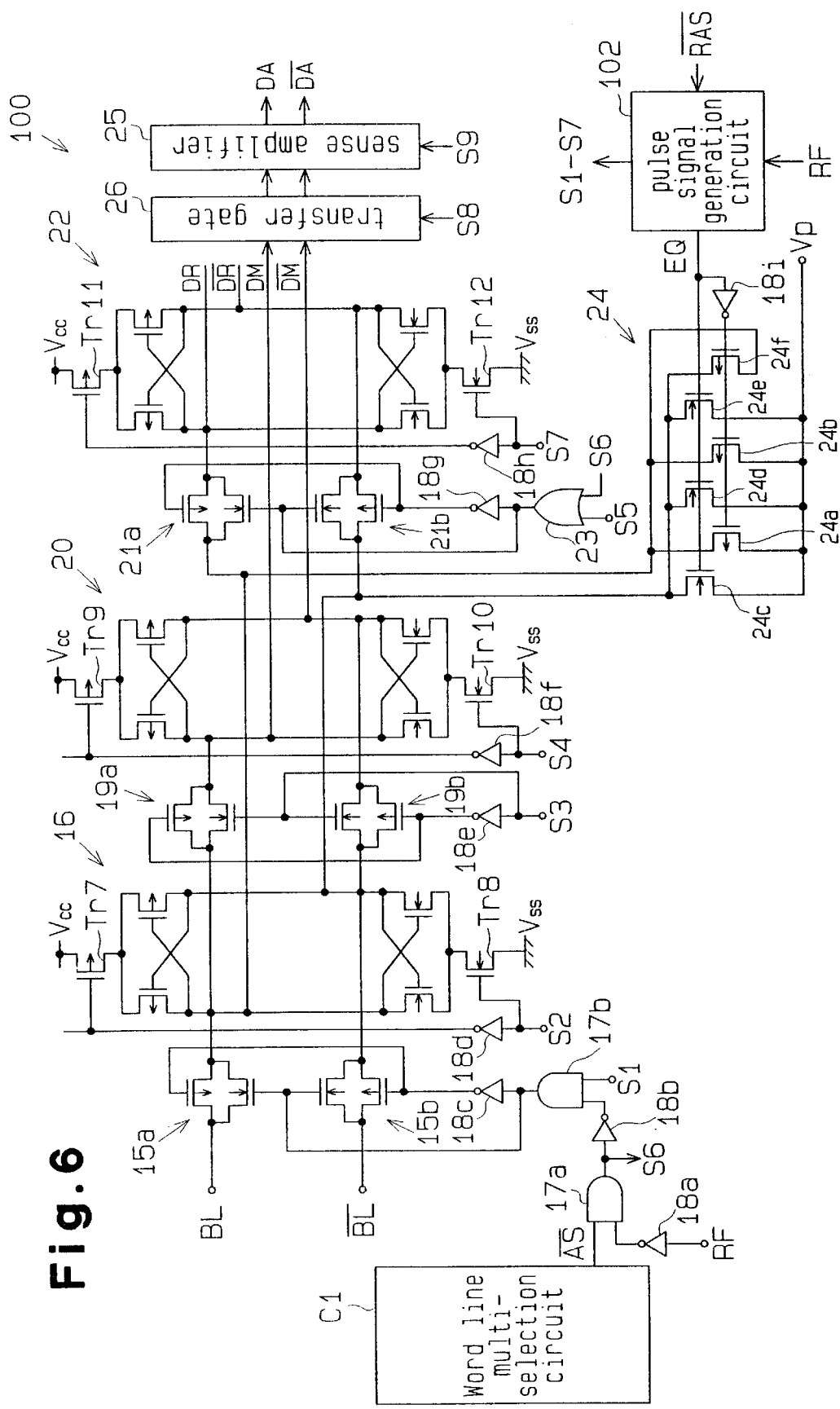
FIG. 6 is a schematic diagram of a register circuit of a sense amplifier and I/O gate of the DRAM of FIG. 2.

FIG. 6 shows a specific circuit arrangement of a register circuit 100 which is connected to one bit-line pair BL and /BL and is preferably incorporated in the sense amplifier circuit 6. The register circuit 100 comprises a refresh register 16, a master register 20, a slave register 22 and six transfer gates 15a, 15b, 19a, 19b, 21a and 21b which connect the registers 16, 20 and 22 to the bit lines BL and /BL.

The bit lines BL and /BL are connected to the refresh register 16 through the transfer gates 15a and 15b, which are controlled by the inverted address coincidence signal /AS, refresh signal RF and activation signal S1. Specifically, the inverted address coincidence signal /AS is provided to an AND gate 17a, which also receives an inverted refresh signal RF through an inverter 18a. The AND gate 17a outputs an output signal through an inverter 18b to another AND gate 17b, which also receives the activation signal S1. The AND gate 17b outputs an output signal to the n-channel gates of the transfer gates 15a and 15b, and an inverted output signal of the AND gate 17b is provided through an inverter 18c to the p-channel gates of the transfer gates 15a and 15b. Accordingly, the transfer gates 15a and 15b are conductive in response to a high level output signal of the AND gate 17b and are non-conductive in response to a low level output signal of the AND gate 17b.

The refresh register 16 preferably comprises a CMOS latch circuit which functions as a sense amplifier and is connected to the high power voltage Vcc through a p-channel MOS transistor Tr7 and to the low power voltage Vss through an n-channel MOS transistor Tr8. The gate of the transistor Tr8 receives a second activation signal S2, and the gate of the transistor Tr7 receives the second activation signal S2 inverted through an inverter 18d. Accordingly, the activation signal S2, when high, causes the transistors Tr7 and Tr8 to turn on, which activates the refresh register 16, which expands a small voltage difference between the bit lines BL and /BL to virtually the voltage difference between the high and low power voltages Vcc and Vss. The second activation signal S2, when low, causes the transistors Tr7 and Tr8 to turn off, which inactivates the refresh register 16.

The bit lines BL and /BL are also connected to the master register 20 by way of the transfer gates 15a and 15b and transfer gates 19a and 19b. The n-channel gates of the transfer gates 19a and 19b receive a third activation signal S3, and the p-channel gates of the transfer gates 19a and 19b receive the activation signal S3 inverted through an inverter 18e. Accordingly, the transfer gates 19a and 19b are conductive in response to the third activation signal S3 being high and are non-conductive in response to the activation signal S3 being low.

The master register 20 has the same arrangement as the refresh register 16 and is connected to the high power voltage Vcc through a p-channel MOS transistor Tr9 and to the low power voltage Vss through an n-channel MOS transistor Tr10. The gate of the transistor Tr10 receives a fourth activation signal S4 and the gate of the transistor Tr9 receives the fourth activation signal S4 inverted through an inverter 18f. Accordingly, the fourth activation signal S4 causes the transistors Tr9 and Tr10 to turn on to activate the master register 20, which expands a small voltage difference between the bit lines BL and /BL to virtually the voltage difference between the high and low power voltages Vcc and Vss and outputs the voltages as output signals DM and /DM. When the fourth activation signal S4 is low, the transistors Tr10 and Tr9 turn off to inactivate the refresh register 20.

The bit lines BL and /BL are also connected to the slave register 22 by way of the transfer gates 15a and 15b and transfer gates 21a and 21b. The n-channel gates of the transfer gates 21a and 21b receive the output signal of an OR gate 23, and the p-channel gates of the transfer gates 21a and 21b receive an inverted output signal of the OR gate 23 through an inverter 18g. The OR gate 23 receives fifth and sixth activation signals S5 and S6. The sixth activation signal S6 is the output signal of the AND gate 17a. Accordingly, the transfer gates 21a and 21b are conductive in response to at least one of the high-level activation signals S5 and S6, and are non-conductive in response to the low-level activation signals S5 and S6.

The slave register 22 has the same arrangement as the master register 20 and is connected to the high power voltage Vcc through a p-channel MOS transistor Tr11 and to the low power voltage Vss through an n-channel MOS transistor Tr12. The gate of the transistor Tr12 receives a seventh activation signal S7, and the gate of the transistor Tr11 receives the seventh activation signal S7 inverted through an inverter 18h. Accordingly, a high-level activation signal S7 causes the transistors Tr11 and Tr12 to turn on to activate the slave register 22, which expands a small voltage difference between the bit lines BL and /BL to virtually the voltage difference between the high and low power voltages Vcc and Vss and outputs the voltages as output signals DR and /DR. The low-level activation signal S7 causes the transistors Tr11 and Tr12 to turn off to inactivate the slave register 22.

The master register 20 outputs output signals DM and /DM through a transfer gate 26 to a sense amplifier 25, which outputs read-out data DA and /DA.

The bit lines BL and /BL are connected to a precharge circuit 24 which precharges the bit lines EL and /BL to an intermediate voltage VP between the high and low power voltages Vcc and Vss. The precharge circuit 24 connects the bit lines EL and /BL to the precharge voltage source VP through two p-channel MOS transistors 24a, 24b and three n-channel MOS transistors 24c, 24d and 24e, and connects the bit lines EL and /BL to each other through a p-channel MOS transistor 24f. The precharge circuit 24 receives an equalize signal EQ on the gates of the n-channel MOS transistors 24c, 24d and 24e and receives an inverted equalize signal EQ on the gates of the p-channel MOS transistors 24a and 24b through an inverter 18i. The gate of the transistor 24f receives the inverted equalize signal EQ. Accordingly, a high-level equalize signal EQ causes all transistors 24a to 24f to turn on to precharge the bit lines BL and /BL to the intermediate voltage VP. A low-level equalize signal EQ causes all transistors 24a to 24f to turn off so that the precharge circuit 24 is inactivated.

Figure 7:
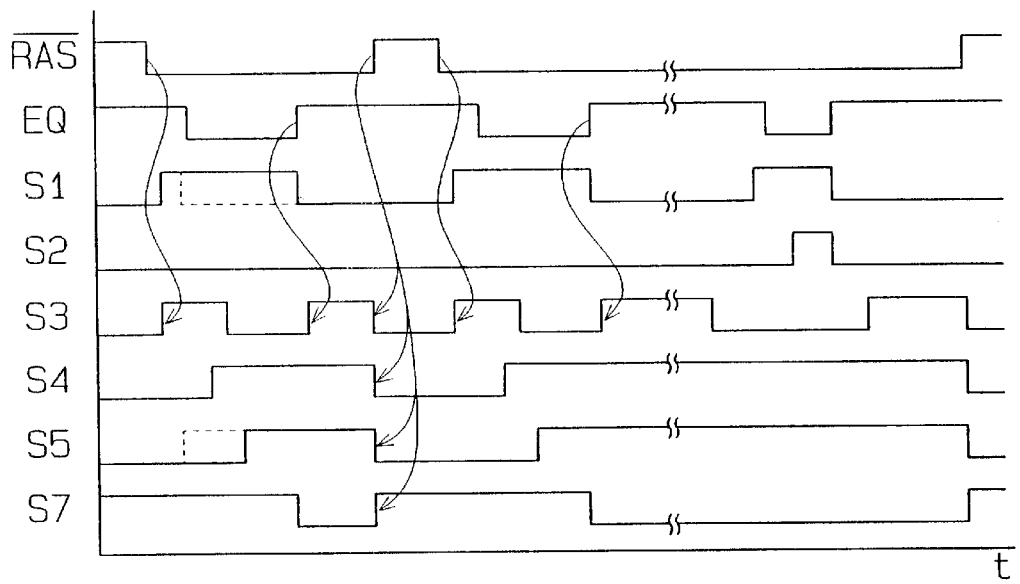
FIG. 7 is a timing chart showing the sequence of a operation of the register circuit of FIG. 6.

FIG. 7 shows the timing relationship among the equalize signal EQ and activation signals S1–S7 which control the register circuit 100. The signals EQ and S1–S7 are produced from the control signal /RAS by a pulse signal generation circuit 102 (FIG. 6).

The equalize signal EQ is generated to stay low for a certain duration after the falling of the control signal /RAS and within the low-level period of the control signal /RAS in case the signal /RAS goes high and low in consecutive cycles. Otherwise, if the control signal /RAS does not alternate for a certain time length, the equalize signal EQ goes low during a refresh-mode operation in response to the refresh signal RF provided by a refresh timer circuit (not shown).

The activation signal SI is generated to stay high for a certain duration in response to the control signal /RAS being low. During the refresh cycle, the signal Si goes high at a certain time interval in synchronism with the equalize signal EQ.

The activation signal S2 is generated to go high in synchronism with the activation signal S1 during the refresh cycle. The activation signal S3 is generated to stay high for a certain duration in response to the control signal /RAS being low. The activation signal S3 further goes high in response to a high-level equalize signal EQ and goes low in response to a high-level control signal /RAS.

The activation signal S4 is generated to go high on expiration of a certain time length following the fall of the control signal /RAS and to go low in response to a high-level signal /RAS. The activation signal S5 is generated to go high on expiration of a certain time length following the fall of the control signal /RAS and to go low in response to a high-level signal /RAS. The activation signal S6 is the output signal of the AND gate 17a. The signal S7 is generated to go low on expiration of a certain time length following the fall of the control signal /RAS and to go high in response to a high-level signal /RAS. The activation signal S7 is maintained low in the refresh cycle.

The precharge circuit 24 is activated in response to a high-level equalize signal EQ throughout the high-level period of the control signal /RAS. Since the transfer gates 15a, 15b, 19a, 19b, 21a and 21b are non-conductive in this period, the bit lines BL and /BL between the transfer gates 15a and 15b and 19a and 19b are precharged to the intermediate voltage VP. The activation signal S7 is high in this period, and the slave register 22 is activated to latch the cell information that has been read from the selected memory cell in the previous cycle.

The operation of a read mode is detailed below. When the control signal /RAS goes low, the activation signal Si goes high, causing the AND gate 17b to output a high-level output signal, and the transfer gates 15a and 15b to be conductive. Consequently, the bit lines BL and /BL are precharged to the intermediate voltage VP. At the same time, the activation signal S3 goes high, causing the transfer gates 19a and 19b to be conductive to connect the master register 20 to the bit lines BL and /BL, and then the equalize signal EQ goes low to inactivate the precharge circuit 24. Subsequently, cell information is read from the selected memory cell onto the bit lines BL and /BL. The activation signal S2 is maintained low at this time, and the refresh register 16 is maintained inactive.

The activation signal S4 then goes high to activate the master register 20, which amplifies a small voltage difference between the bit lines BL and /BL. The activation signal S3 then goes low, causing the transfer gates 19a and 19b to be non-conductive, and the master register 20 is disconnected from the bit lines BL and /BL.

The activation signal S5 then goes high, causing the transfer gates 21a and 21b to be conductive, and the read-out data DR and /DR of the previous cycle held in the slave register 22 is provided to the bit lines BL and /BL.

The activation signal S1 then goes low, causing the transfer gates 15a and 15b to be non-conductive, and the equalize signal EQ goes high to provide the output signals DR and /DR of the slave register 22. The activation signal S7 then goes low to inactivate the slave register 22, and the activation signal S3 goes high, causing the transfer gates 19a and 19b to be conductive.

When the control signal /RAS goes high, the activation signal S7 goes high and the activation signals S3, S4 and S5 go low, causing the data DM and /DM latched in the master register 20 to be latched by the slave register 22, and the operation of one read cycle is completed.

The operation of a refresh mode is detailed below. When the refresh signal RF is low, causing the AND gate 17a to output a low-level output signal, and the inverter 18b outputs a high-level output signal.

The activation signal S1 goes high at a certain time interval, causing the transfer gates 15a and 15b to be conductive at a predetermined time interval. The equalize signal EQ goes low following the rise of the activation signal S1, causing the bit lines BL and /BL to be precharged to the intermediate voltage VP in response to the high-level activation signal S1.

After the equalize signal EQ has gone low, cell information is read from the selected memory cell onto the bit lines BL and /BL. The activation signal S2 then goes high, and the activation signal Si is still high. Consequently, the refresh register 16 is activated, and the cell information provided to the bit lines BL and /BL is amplified by the refresh register 16 and written back to the memory cell. The activation signal S1 then goes low, causing the transfer gates 15a and 15b to be non-conductive, and the equalize signal EQ goes high to activate the precharge circuit 24.

In the read mode, when the row addresses are the same in both the previous and current read cycles, the word line multi-selection circuit C1 outputs a high-level address coincidence signal AS. Consequently, as shown by dot line in FIG. 7, the activation signal S1 goes high in response to the fall of the control signal /RAS, but then goes low currently, causing the transfer gates 15a and 15b to be non-conductive. The activation signal S5 goes high substantially simultaneously with the rise of the activation signal S1, causing the slave register 22 and master register 20 to hold the same data.

The operation of the DRAM will be explained with reference to FIG. 8. When the control signal /RAS goes low, the row decoder 2 activates a word line WL1 to a high level in accordance with a row address signal R1 from an external device. The word line multi-selection circuit C1 deactivates the selected word line WL1 to a low level on expiration of the delay time of the delay circuit 13a. The word line multi-selection C1 circuit associated with the word line WL2 selected in the previous cycle activates the word line WL2.

At this time, in the sense amplifier circuit 6, read data RD is read onto the bit lines BL and /BL from the selected memory cell that is connected to the word line WL1, and read data RD is latched by the master register 20. Thereafter, the master register 20 is disconnected from the bit lines BL and /BL.

The slave register 22 is then connected to the bit lines BL and /BL, and write-back data WD, which has been read in the previous cycle and latched for write-back in the slave register 22, is provided to the bit lines BL and /BL. Since the word line multi-selection circuit C1 activates the word line WL2 selected in the previous cycle, the data WD is written back to the memory cell associated with the word line.

At the time of selection of the word line WL1, the transfer gate 26 between the master register 20 and slave register 22 of the column selected by a column address signal is conductive in response to the activation signal S8.

Read data RD is read from the memory cell selected by the word line WL1 onto the bit lines BL and /BL, when the amplified signals DM and /DM of the read data RD are output from the master register 20. The sense amplifier 25 is activated by the activation signal S9, amplifies the signals DM and /DM and latches and outputs the output data signals. The activation signal S8 goes low following the rise of the activation signal S9, and the sense amplifier 25 is disconnected from the master register 20.

When the word line WL1 is deactivated and the control signal /RAS goes high, the read-out data RD latched in the master register 20 is written as write-back data WD into the slave register 22.

In the next cycle, another word line WL2 is selected in accordance with a row address signal R2. Data read onto the bit lines BL and /BL from the memory cell which is connected to the word line WL2 is latched by the master register 20, and the data is outputted to the sense amplifier 25. Then, the word line WL1 selected in the previous cycle is activated, and the write-back data WD latched in the slave register 22 is written back into the memory cell associated with the word line WL1. In response to the rise of the control signal /RAS, the read data RD of the next cycle latched in the master register 20 is provided to the slave register 22. These operations are repeated to read cell information continuously.

In the refresh-mode, the transfer gates 15a and 15b and refresh register 16 operate in response to the activation signals S1 and S2 following the selection of a word line to refresh cell information.

The DRAM according to the first word line selection scheme has the following features.

(1) In the read mode, a read-out word line is selected in a one-cycle period from the rise to fall of the control signal /RAS in accordance with the row address signal of the current cycle, and then the read-out word line associated with the row address signal of the previous cycle is selected as a write-back word line. In case the previous and current cycles have row address signals of different addresses, two word lines are selected for data read-out and write-back sequentially.

(2) Read data RD read based on the selection of a read-out word line is latched in the master register 20, and the sense amplifier 25 amplifies the output signals DM and /DM of the master register 20. Accordingly, the sense amplifier 25 is disconnected from the bit lines BL and /BL and from numerous memory cells which are connected to the bit lines BL and /BL, and the load of the sense amplifier 25 is reduced.

(3) At the selection of a write-back word line, the read-out word line of the previous cycle is selected to write the write-back data WD, which has been read and latched in the slave register 22, back to the memory cell. Since the write-back operation is performed by the slave register 22, the sense amplifier 25 is not required to have a large output capacity for writing cell information back to a memory cell.

(4) The sense amplifier 25 with a smaller output capacity is configured of smaller transistors in a smaller area. The sense amplifier with a smaller output capacity has a high input sensitivity, and accordingly speeds up the read-out of cell information.

(5) The master register 20 and slave register 22 operate stably for latching and writing back cell information even though the read-out word line and write-back word line are activated for a reduced duration. The write-back word line is inactivated earlier than the rise of the control signal /RAS. Accordingly, the control signal /RAS has a shortened high-level period. Specifically, the time length t2 out of the inactive period shown in FIG. 8 is eliminated in the first embodiment. As a result, the cycle time of reading out cell information is reduced and the read-out of cell information is sped up.

(6) In case the same word line is selected in both the previous and current read cycles, write-back data latched in the slave register 22 is provided to the master register 20 by the address coincidence signal AS. Accordingly, the need of selecting a read-out word line for the current cycle is eliminated. Furthermore, since cell information write-back operation of the current cycle and cell information write-back operation of the next cycle are for the same memory cell and the same cell information, the cell information write-back operation of the current cycle is eliminated.

Accordingly, the need of selecting a write-back word line for the current cycle is eliminated.

In case the same word line is selected in both the previous and current cycles, selection of a read-out and write-back word lines for the current cycle is suspended. The elimination of unnecessary word line selecting operation reduce the power consumption of the memory device. Moreover, the elimination of unnecessary word line selecting operations shortens the duration of application of the step-up voltage to memory cells, and the aging of memory cells is retarded.

(7) Two word lines WL1 and WL2 are selected in one cycle, and the duration of retention of these word lines at the step-up voltage is shortened. Accordingly, the duration of application of the step-up voltage to memory cells is shortened, and the aging of memory cells is retarded.

Figure 8:
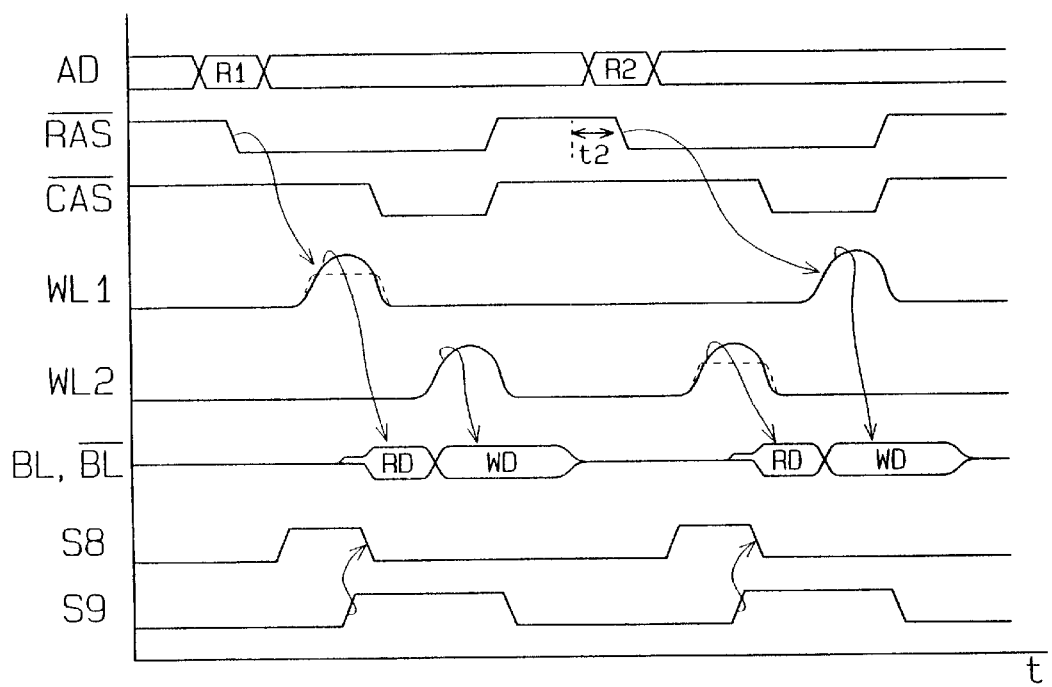
FIG. 8 is a timing chart showing the sequence of read operation based on a first word line selection scheme.

(8) Read-out word lines are selected for reading out cell information from memory cells in each cycle, and therefore read-out word lines may be pulled up to the high power voltage Vcc as shown by dot line in FIG. 8 instead of the much higher step-up voltage. This scheme speeds up the rising and falling of read-out word lines and accordingly speeds up the read operation. The lower word line pull-up voltage reduces the power consumption and retard the aging of memory cells.

2. Second word line selection scheme

Figure 14:
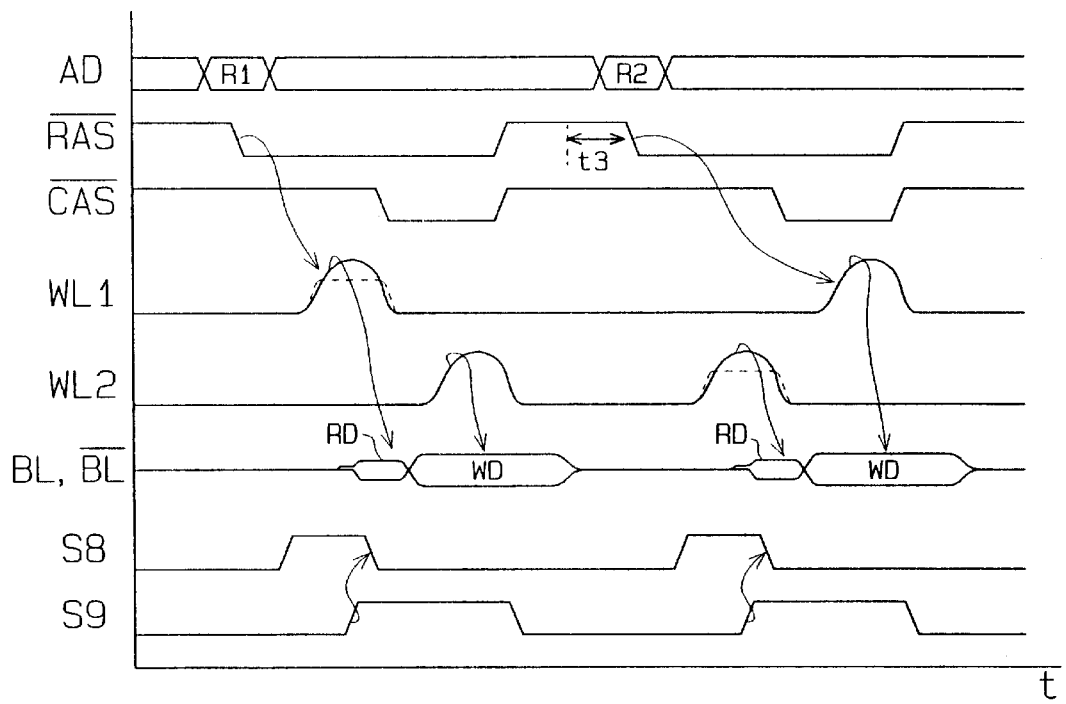
FIG. 14 is a timing chart showing the sequence of a read operation based on a second word line selection scheme.

The semiconductor memory device of the first embodiment reads cell information by selecting word lines in accordance with a second word line selection scheme, as shown by the timing chart of FIG. 14. After a read-out word line WL1 selected in a read cycle has activated and read-out data RD has been latched by the master register 20, disconnection of the master register 20 from the bit lines BL and /BL and connection of the slave register 22 to the bit lines BL and /BL occurs much sooner than in the first word line selecting scheme.

The write-back data WD held by the slave register 22 is provided to the bit lines BL and /BL prior to the rise of the write-back word line WL2, allowing the write-back data WD on the bit lines BL and /BL to be written back to the selected memory cell currently after the word line WL2 is selected.

Thus, the duration of retention of the write-back word line WL2 at the high level is decreased, and the timing of lowering the write-back word line WL2 is advanced more than the first word line selecting scheme. Accordingly, the time length t3 out of the high-level period of the control signal /RAS is decreased. Consequently, the cycle time of reading out cell information is decreased, which speeds up the read operation.

3. Third word line selection scheme

Figure 15:
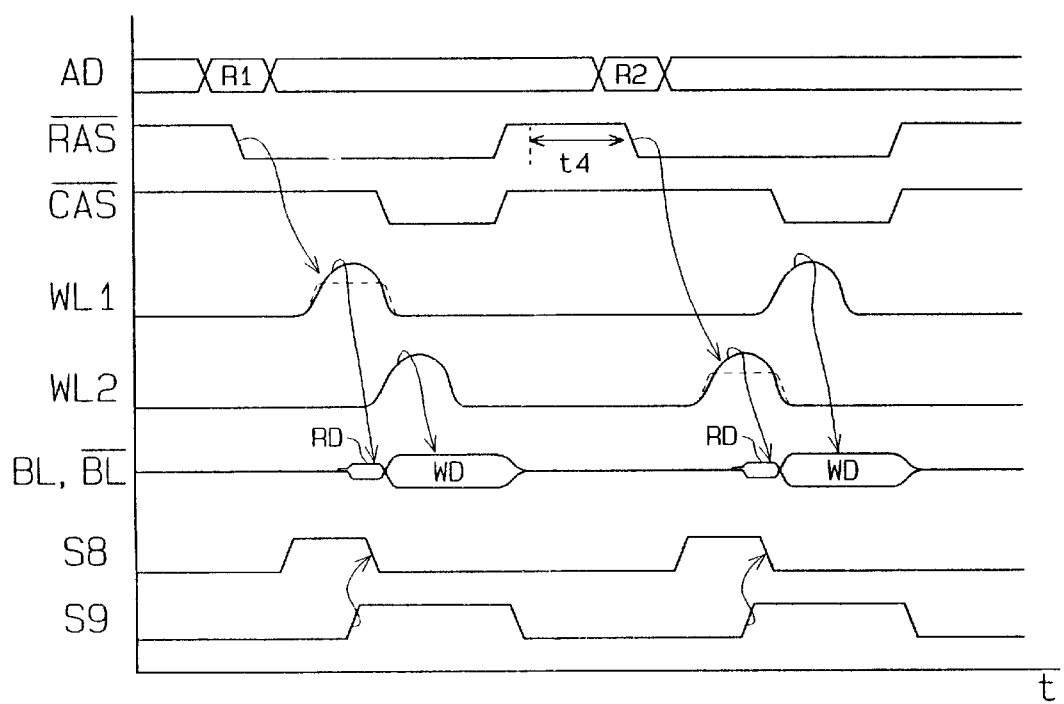
FIG. 15 is a timing chart showing the sequence of a read operation based on a third word line selection scheme.

The semiconductor memory device of the first embodiment reads cell information by selecting word lines in accordance with a third word line selection scheme, as shown by the timing chart of FIG. 15. When a read-out word line WL1 which is first selected is inactivated, a write-back word line WL2 which is second selected is activated. The word line selection timing is accomplished by configuring the delay circuit 13a in two parts so that one delay circuit inactivates the word line WL1 and a second delay circuit activates the word line WL2.

This operation results in a momentary dual selection of the read-out word line WL1 and write-back word line WL2, causing the memory cell selected by the read-out word line WL1 to have its cell information corrupted by being overwritten by the write-back data WD which is written back to the memory cell selected by the write-back word line WL2. However, the memory cell selected by the read-out word line WL1 has its cell information corrupted even normally by the read operation, and it is restored by the write-back operation of the slave register 22 in the next cycle. Therefore, such complete corruption of cell information is inconsequential.

The third word line selection scheme, which performs the momentary dual selection of word lines WL1 and WL2 within a cycle, advances the selection of secondary the write-back word line WL2 and advances the fall of the write-back word line WL2. Accordingly, a time length t4 out of the inactive high-level period of the control signal /RAS is decreased. Consequently, the cycle time of reading out cell information to speed up the read operation is shortened.

Second Embodiment

1. Fourth word line selection scheme

Figure 9:
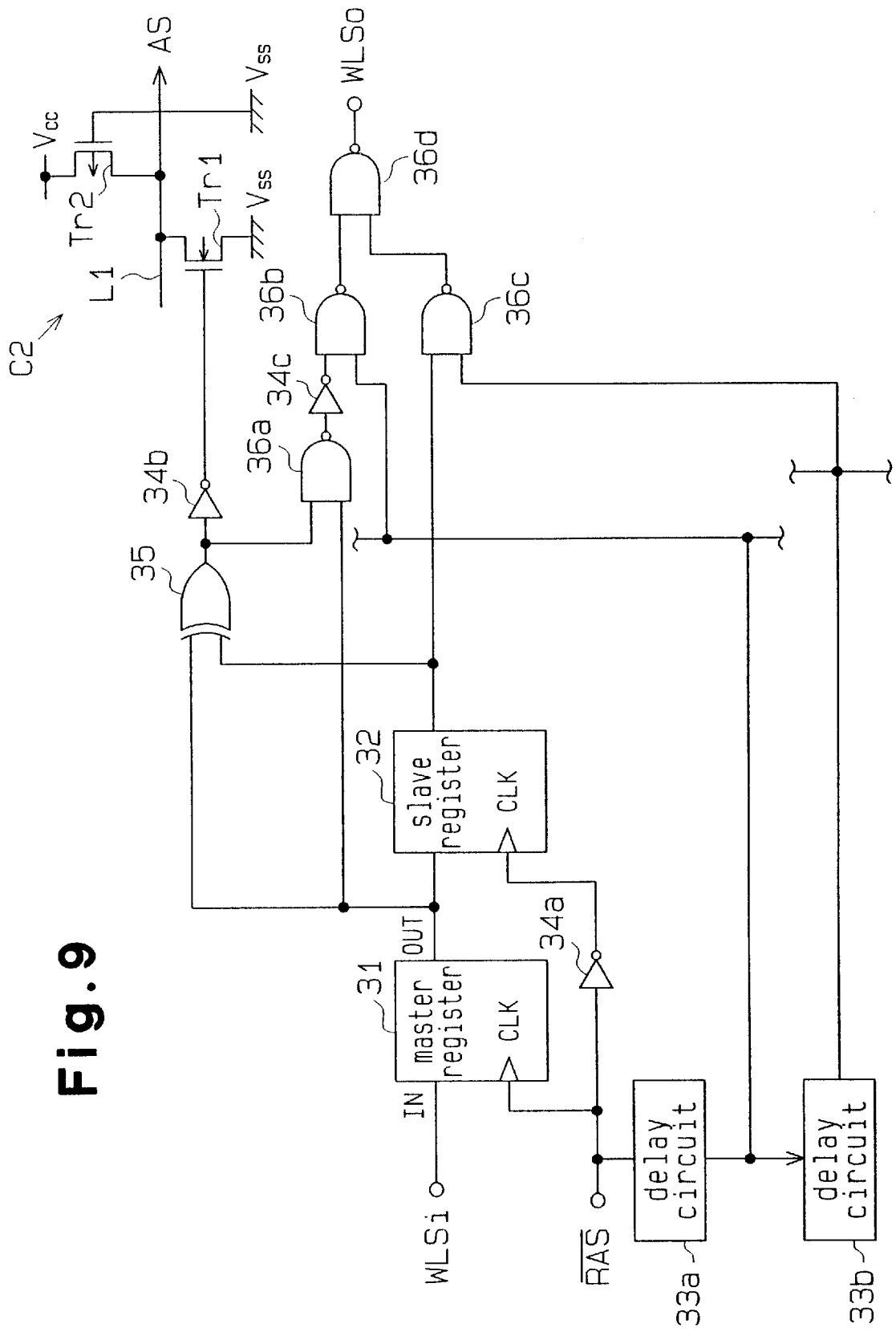
FIG. 9 is a schematic diagram of a word line multi-selection circuit according to a second embodiment of the present invention.
Figure 16:
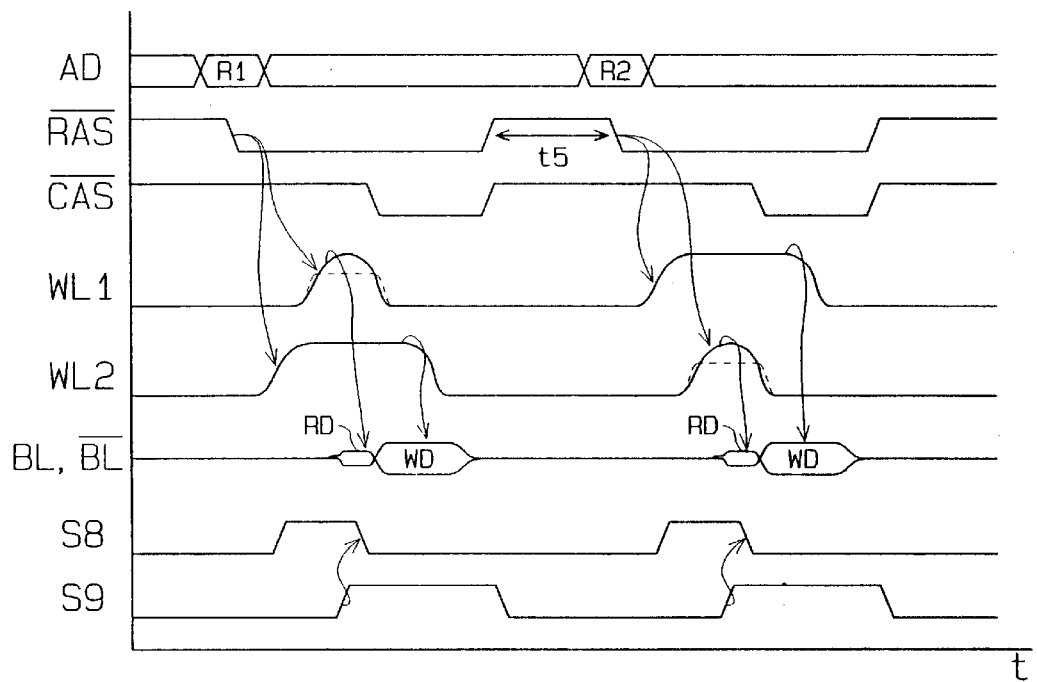
FIG. 16 is a timing chart showing the sequence of a read operation based on a fourth word line selection scheme.

A semiconductor memory device based on the second embodiment of the present invention includes a word line multi-selection circuit C2 shown in FIG. 9, while the register circuit 100 is the same as the first embodiment. In the second embodiment, the semiconductor memory device operates in accordance with a fourth word line selection scheme, as shown in FIG. 16. The fourth word line selection scheme performs a dual selection of two word lines in one cycle by first activating the write-back word line WL2 and next activating the read-out word line WL1. Accordingly, the timing of activating the word lines WL1 and WL2 is advanced, and the time length t5 out of the inactive high-level period of the control signal /RAS is shorter than the preceding first through third word line selection schemes. Consequently, the cycle time of reading out cell information is shortened, which speeds up the read operation.

Referring to FIG. 9, the master register 31 and slave register 32 are identical in arrangement to the master register 8 and slave register 9 of the first embodiment. The master register 31 receives a word line selecting signal WLSi as input signal IN, and outputs an output signal OUT which is input to the slave register 32. The control signal /RAS is provided as a clock signal CLK to the master register 31, and an inverted control signal RAS is provided to the slave register 32 via an inverter 34a as a clock signal CLK. The registers 31 and 32 output signals are input to an exclusive-OR gate 35, which supplies its output through an inverter 34b to the base of a transistor Tr1. The transistor Tr1, signal line L1, and transistor Tr2 are the same as the first embodiment, with the low-level address coincidence signal AS being produced when the transistor Tr1 turns on.

The control signal /RAS is provided to a delay circuit 33a, which outputs an output signal to another delay circuit 33b. The delay circuit 33a delays the control signal /RAS by a certain time length, and the delay circuit 33b further delays the output signal of the delay circuit 33a.

The exclusive-OR gate 35 outputs an output signal to one input terminal of a NAND gate 36a. A second input terminal of the NAND gate 36a receives the output signal OUT of the master register 31. The NAND gate 36a outputs an output signal through an inverter 34c to one input terminal of a NAND gate 36b. A second input terminal of the NAND gate 36b receives the output signal of the first delay circuit 33b.

The slave register 32 output signal and the output signal of the delay circuit 33b are provided to one input terminal of a NAND gate 36c. The NAND gates 36b and 36c have their output signals provided to another NAND gate 36d, which outputs the word line selecting signal WLSo.

Concerning the read-out word line WL1, the word line selecting signal WLSi has a low level at the time of falling of the control signal /RAS. This is because the signal WLSi has been low in the previous cycle and the row decoder 2 produces the word line selecting signal WLSi high in response to the fall of the control signal /RAS.

The master register 31 and slave register 32 output signals low, causing the NAND gate 36c to output a high-level output signal irrespective of the output signal of the delay circuit 33b. The exclusive-OR gate 35 receives two low-level input signals, outputting a low-level output signal, and the NAND gate 36a produces a high-level output signal. The inverter 34c outputs a low-level output signal, causing the NAND gate 36b to output a high-level output signal, and the word line selecting signal WLSo produced by the NAND gate 36d goes low.

When the word line selecting signal WLSi goes high, the output signal OUT of the master register 31 goes high. Then, the exclusive-OR gate 35 outputs a high-level output signal, and the NAND gate 36a receives two high-level input signals to output a low-level output signal, causing the inverter 34c to output a high-level output signal.

The output signal of the delay circuit 33a is still high at this time, and the NAND gate 36b receives two high-level input signals to output a low-level output signal. Consequently, the word line selecting signal WLSo outputted from the NAND gate 36d goes high.

When the output signal of the delay circuit 33a goes low on expiration of its delay time, the output signal of the NAND gate 36b goes high. Consequently, the word line selecting signal WLSo outputted from the NAND gate 36d goes low. Accordingly, the word line selecting signal WLSo rises and retains the high level for the duration of the delay time of the delay circuit 33a following the rise of the word line selecting signal WLSi.

Concerning the write-back word line WL2, the word line selecting signal WLSi has been high in the previous cycle, the word line selecting signal WLSi is kept at the low level in the current cycle. When the control signal /RAS goes low in this state, the output signals of the master register 31 and slave register 32 go low and high, respectively. Then, the NAND gate 36a outputs a high-level output signal and the inverter 34c outputs a low-level output signal, causing the NAND gate 36b to output a high-level output signal.

The slave register 32 outputs the high-level output signal and the delay circuit 33b still outputs the high-level output signal, causing the NAND gate 36c to output a low-level output signal, and the word line selecting signal WLSo outputted from the NAND gate 36d goes high.

When the output signal of the delay circuit 33b goes low on expiration of its delay time, the NAND gate 36c outputs a high-level output signal, and the word line selecting signal WLSo outputted from the NAND gate 36d goes low. Accordingly, the word line selecting signal WLSo is high for the duration of the delay times of the delay circuits 33a and 33b following the fall of the control signal /RAS.

Based on this operation, when the control signal /RAS goes low, the write-back word line WL2 first goes high, and next the read-out word line WL1 goes high as shown in FIG. 16. The delay circuits 33a and 33b have their delay times set such that the read-out word line WL1 goes low prior to the fall of the write-back word line WL2.

The operation of the DRAM according to the fourth word line selection scheme will be explained with reference to FIG. 16. When the control signal /RAS goes low in the presence of an input row address signal R1, the write-back word line WL2 first goes high. At this time, the memory cell selected by the word line WL2 in the previous cycle has its cell information corrupted. In the register circuit 100, the equalize signal EQ is kept high, as shown in FIG. 7, and the transfer gates 15a and 15b are conductive, causing the bit lines BL and /BL to be precharged to the intermediate voltage VP. The voltage VP is written into the memory cell selected by the word line WL2.

After the equalize signal EQ goes low, the read-out word line WL1 selected in accordance with the row address signal R1 is activated, resulting in a state of dual selection of the word lines WL1 and WL2. The memory cell selected by the write-back word line WL2 stores the intermediate voltage VP at this time point, and it does not affect the read-out operation for the memory cell selected by the read-out word line WL1.

Read data RD is read from the memory cell selected by the word line WL1 onto the bit lines BL and /BL to produce a small voltage difference. At this time, the cell information of the memory cell selected by the word line WL1 is corrupted. The bit lines BL and /BL are connected to the master register 20 and the read-out data RD is latched. The activation signal S8 is high at this time, allowing the read-out data RD to be input to the sense amplifier 25, which is activated by the activation signal S9 to deliver the amplified read-out data signal therefrom.

The word line WL1 then goes low, causing the master register 20 to be disconnected from the bit lines BL and /BL, and the slave register 22 to be connected to the bit lines BL and /BL so that the write-back data WD, which has been read in the previous cycle and held by the slave register 22, is written back to the memory cell.

The word line WL2 then goes low, and the read-out data RD, which is latched in the master register 20, is latched as write-back data WD by the slave register 22 in response to the rise of the control signal /RAS.

In the next cycle, the word line WL1 is selected first as a write-back word line, and, for example, the word line WL2 is selected next as a read-out word line. Even if a memory cell with corrupted cell information has its stored voltage deviating slightly from the intermediate voltage VP, it is restored to the voltage VP by rewriting the voltage VP at the selection of the write-back word line WL1, and it does not adversely affect the read-out operation of data RD from the memory cell selected concurrently by the word line WL2.

In case the same word line is selected in both the previous and current cycles and when the word line selecting signal WLSi is brought to the high level in both cycles, the exclusive-OR gate 35 outputs a high-level output signal, causing the NAND gate 36b to output a high-level output signal.

The output signal of the NAND gate 36c is high for the duration of the delay times of the delay circuits 33a and 33b following the fall of the control signal /RAS, and accordingly the word line selecting signal WLSo is maintained at the high level for a certain duration. Consequently, the memory cell selected by the word line which is activated by the word line selecting signal WLSi undergoes the write operation again at the intermediate voltage VP, so that charge is provided to the selected memory cell.

The word line multi-selection circuit C2 of the second embodiment, shown in FIG. 9, may be used for the first through third word line selection schemes by adjusting the delay times of the delay circuits 33a and 33b.

Third Embodiment

Figure 10:
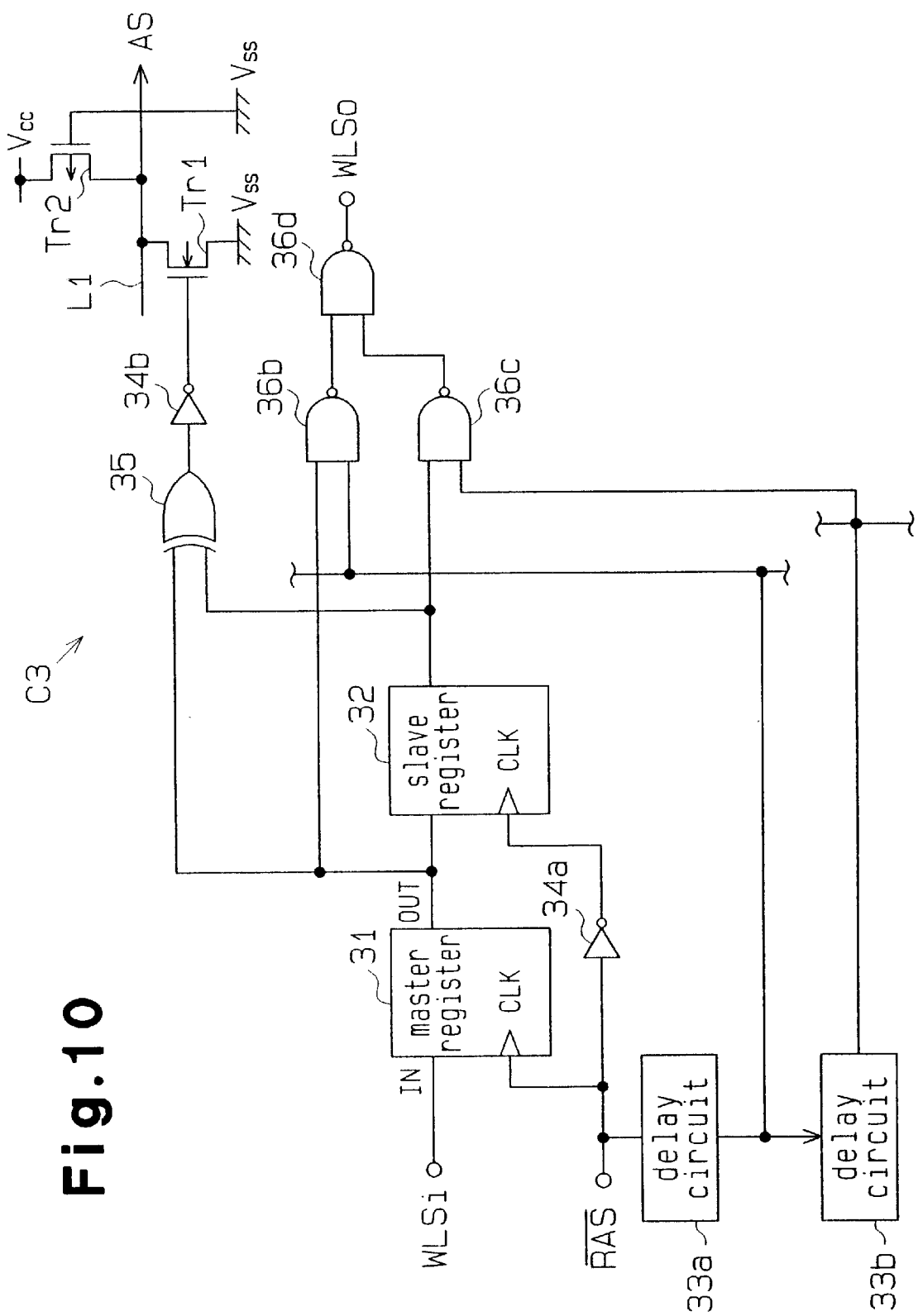
FIG. 10 is a schematic diagram of a word line multi-selection circuit according to a third embodiment of the present invention.

As shown in FIG. 10, a semiconductor memory device based on a third embodiment of the present invention comprises a word line multi-selection circuit C3, which is modified such that the NAND gate 36a and inverter 34c are removed from the second embodiment circuit C2 of FIG. 9. The output signal of the master register 31 is provided directly to the NAND gate 36b, and the output signal of the exclusive-OR gate 35 is provided only to the inverter 34b so that the output signal does not contribute to the word line selecting signal WLSo. The modified arrangement is useful for the first through fourth word line selection schemes.

The word line multi-selection circuit C3 may be used for the input circuit of the row decoder 2. Specifically, the word line multi-selection circuit C3 is provided for each bit of address signal AD. Consequently, the third embodiment has reduced circuit area and power consumption.

The word line multi-selection circuit C3 receives one bit of the row address signal AD from the input buffer circuit 1 and generates and outputs one bit of a new row address signal for selecting a read-out word line and write-back word line within one cycle to the decoder 2.

The address coincidence detection circuit of the circuit C3 is preferably modified such that the address coincidence signal AS having a low level is generated based on the NOR-logic output signal of the exclusive-OR gate 35.

Fourth Embodiment

Figure 11:
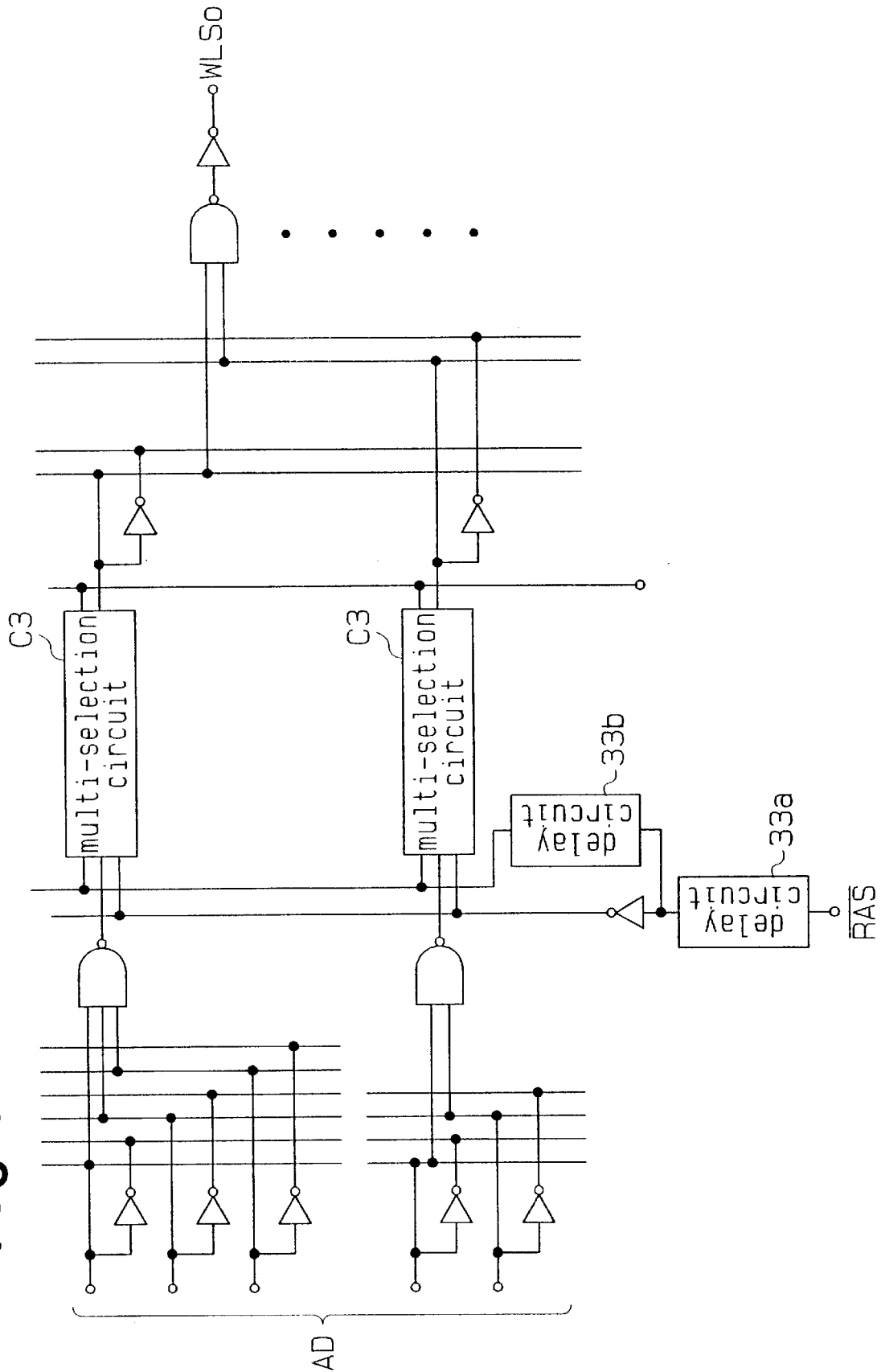
FIG. 11 is a schematic diagram of a row decoder based on a fourth embodiment of the present invention.

A semiconductor memory device based on a fourth embodiment of the present invention comprises the word line multi-selection circuit C3, as shown in FIG. 11, at the middle of the row decoder 2. Specifically, word line multi-selection circuits C3 are located in the intermediate stage of the row decoder 2 to input intermediate decode signals and to produce new intermediate decode signals. The word line selecting signals WLSo for the word line drive circuit 4 are generated from the new intermediate signals.

The disposition of each of the word line multi-selection circuits C3 in the intermediate stage of the row decoder 2 reduces the delay of the output signal of the word line drive circuit 4 from the output signal of each word line multi-selection circuit C3, as compared with the third embodiment. Specifically, in the third embodiment where the word line multi-selection circuit C3 is located in the input section of the row decoder 2, a delay time is created in proportion to the number of stages of the row decoder 2 before a word line is selected in accordance with the output signal bit of the circuit C3, and therefore it necessitates a delay circuit for retarding the operation of the sense amplifier circuit 6 by being timed to the word line selection.

In contrast, in the fourth embodiment, the delay time until a word line is selected in accordance with the output signal of the word line multi-selection circuit C3 is shortened. Accordingly, the delay time of the delay circuit for retarding the operation of sense amplifier circuit 6 is shortened, and a resulting smaller delay circuit reduces the circuit area and power consumption. Moreover, the resulting smaller variability of delay time among products enhances the stability of the read operation and the write operation.

The disposition of the word line multi-selection circuit C3 in the intermediate stage of the row decoder 2 also reduces the number of word line multi-selection circuits as compared with the first and second embodiments. Specifically, different from the first and second embodiments in which word line multi-selection circuits C1 or C2 equal in number to word lines are needed, the fourth embodiment uses a smaller number of word line multi-selection circuits C3. Consequently, it reduces the circuit area and power consumption much more than the first and second embodiments.

Since the output signal of the word line multi-selection circuit C3 does not directly select a specific word line, the fourth embodiment is preferably applied only to the first through third word line selection schemes.

Fifth Embodiment

Figure 12:
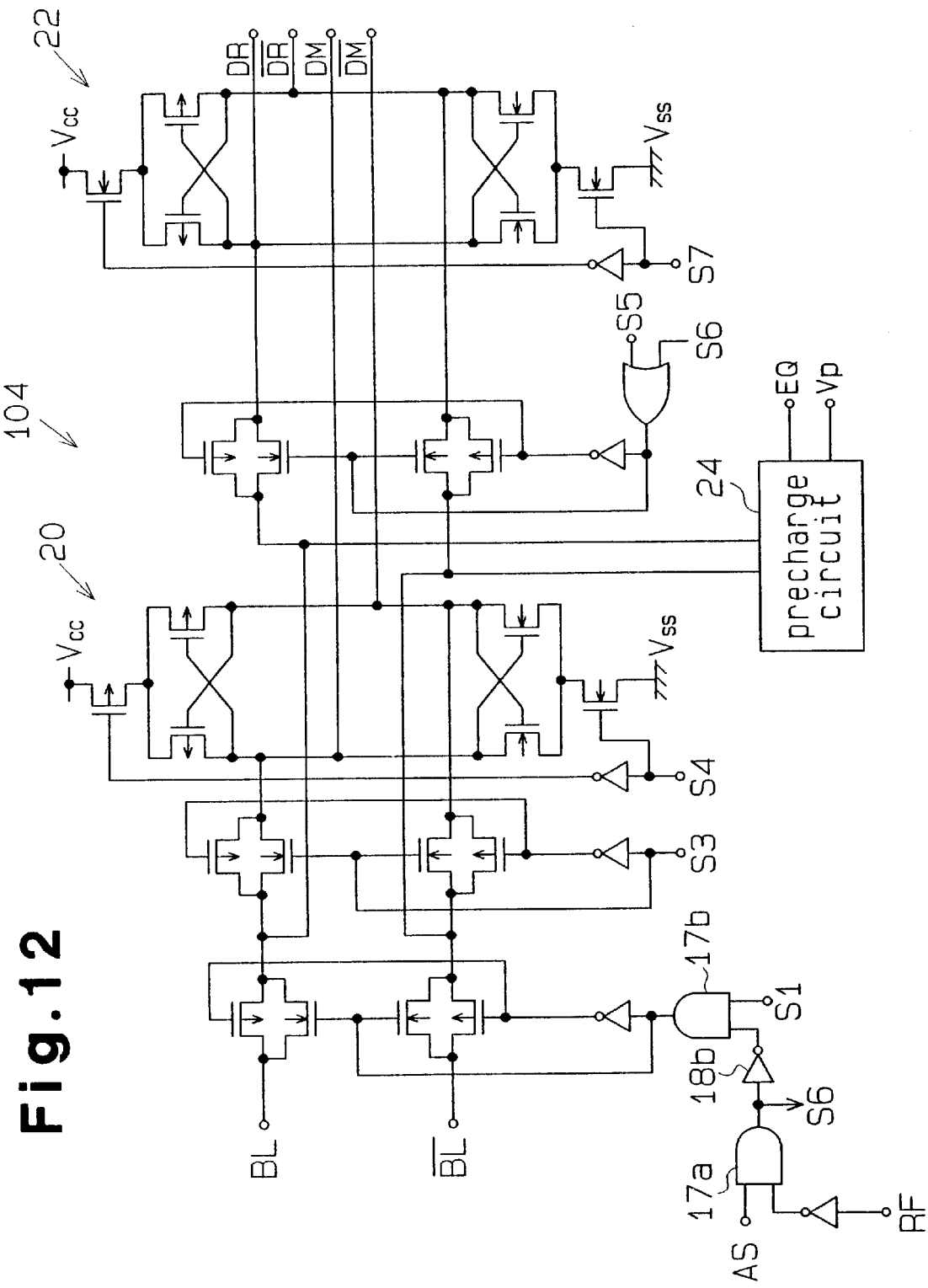
FIG. 12 is a schematic diagram of a register circuit according to a fifth embodiment of the present invention.
Figure 13:
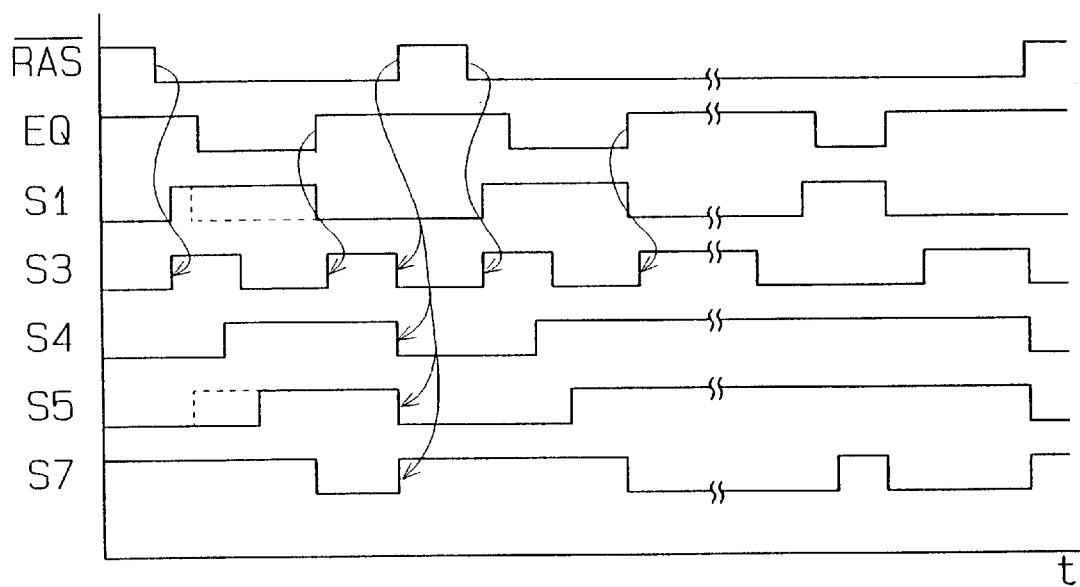
FIG. 13 is a timing chart showing the sequence of a operation of the register circuit of the fifth embodiment.

FIG. 12 is a schematic diagram of a register circuit 104 of the fifth embodiment, with a difference being the removal of the refresh register 16 from the register circuit 100 of FIG. 6. The register circuit 104 is controlled by the control signals S1 to S7 shown in FIG. 13.

During a certain time period in which the control signal /RAS does not change, when the DRAM enters the refresh mode in response to the refresh signal RF provided by the refresh timer (not shown), the equalize signal EQ has a low level at a certain time interval. The activation signals S1 and S3–S5 have the same roles as the first embodiment, while the activation signal S7 is generated to go high after the activation signal S1 has gone high.

The activation signal S7 goes high at the time point when cell information is read onto the bit lines BL and /BL from the memory cell selected by the word line. Based on the sense amplifier circuit 25 after the activation signal S1 goes high in the time period of the low equalize signal EQ, thereby activating the slave register 22. Consequently, the cell information provided to the bit lines BL and /BL is amplified by the slave register 22 and written back to the same memory cell.

This circuit arrangement enables the memory refresh operation by use of the slave register 22, instead of having the refresh register 16 of the preceding embodiments.

Sixth Embodiment

Figure 18:
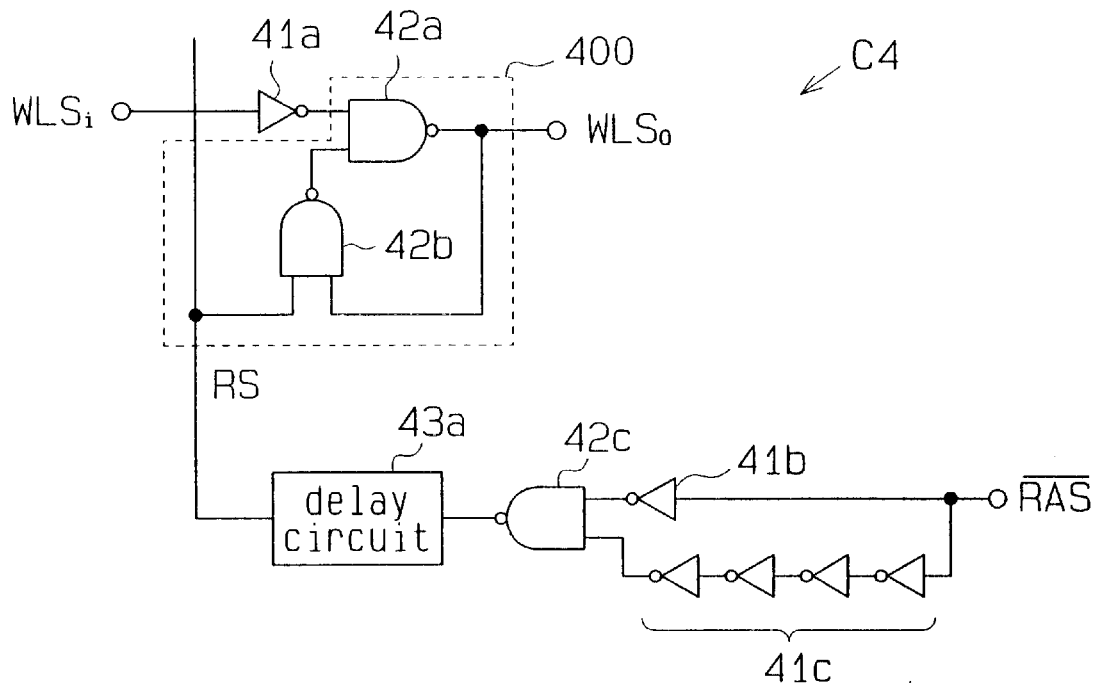
FIG. 18 is a schematic diagram of a word line multi-selection circuit according to a sixth embodiment of the present invention.

FIG. 18 shows a word line multi-selection circuit C4 based on a sixth embodiment of the present invention. The word line multi-selection circuit C4 comprises an RS flip-flop 400. The circuit C4 receives the word line selecting signal WLSi from the row decoder 2 and outputs the word line selecting signal WLSo to the word line drive circuit 4. The RS flip-flop 400 continuously selects the read-out word line of the current cycle for the next cycle in which it is used for a write-back word line, thereby performing the dual selection of the read-out word line and the write-back word line used in two cycles. The RS flip-flop 400 comprises NAND gates 42a and 42b. The word line multi-selection circuit C4 further comprises a reset signal generation circuit including a delay circuit 43a, a NAND gate 42c, an inverter 41b and 4-staged inverters 41c.

The received word line selecting signal WLSi is provided through an inverter 41a to the NAND gate 42a, which outputs its output signal to the NAND gate 42b. Another input of the NAND gate 42b is a reset signal RS output from the delay circuit 43a. The NAND gate 42b outputs an output signal delivered as the word line selecting signal WLSo.

The control signal /RAS is received on the input terminals of the NAND gate 42c through the inverter 41b and through 4-staged inverters 41c. The NAND gate 42c outputs an output signal which goes low for a duration of the delay time of the inverter 41c in response to a low-level control signal /RAS. The output signal of the NAND gate 42c is provided to the delay circuit 43a, which delays the output signal of the NAND gate 42c to produce the reset signal RS. The delay time of the delay circuit 43a is set to be longer than the period of the low-level control signal /RAS.

The RS flip-flop 400 is provided individually for each word line, while the circuit section including the inverters 41b and 41c, NAND gate 42c and delay circuit 43a is common to all of the RS flip-flops 400.

In operation, when the NAND gate 42b receives a low-level reset signal RS from the delay circuit 43a in the presence of a low-level word line selecting signal WLSi, the NAND gate 42a receives two high-level input signals to produce a low-level output signal. The low-level signal WLSi is latched by the RS flip-flop 400 even after the reset signal RS goes high.

When the control signal /RAS goes low and the word line selecting signal WLSi goes high, the inverter 41a outputs a low-level output signal, causing the NAND gate 42a to produce a high-level word line selecting signal WLSo. Consequently, the NAND gate 42b receives two high-level input signals to output a low-level output signal, and the word line selecting signal WLSo is latched at the high level even after the word line selecting signal WLSi goes low.

Subsequently, when a low-level reset signal RS is provided to the NAND gate 42b, the NAND gate 42a receives two high-level input signals, and the word line selecting signal WLSo goes low.

Figure 17:
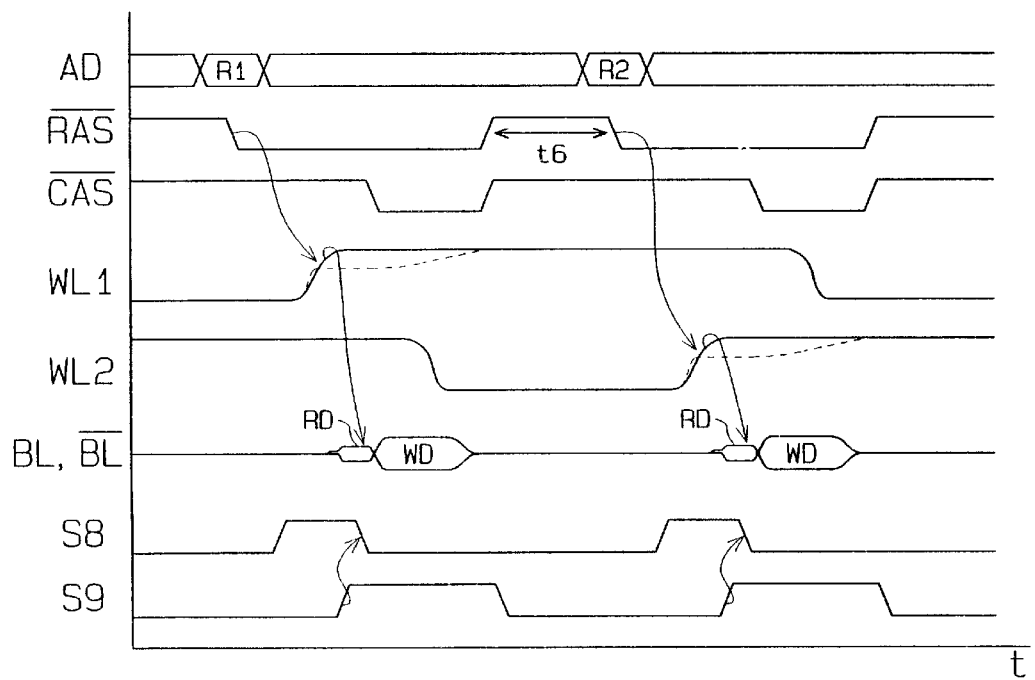
FIG. 17 is a timing chart showing the sequence of a read operation based on a fifth word line selection scheme.

The operation of the DRAM having the word line multi-selection circuit C4 and the register circuit 100 of FIG. 6 will be explained with reference to FIG. 17.

The write-back word line WL2 which has been selected in the previous cycle retains high, and the bit lines BL and /BL are precharged to the intermediate voltage VP and the voltage VP is stored in the memory cell selected by the write-back word line WL2 by the operation of the register circuit 100.

In this state, the control signal /RAS goes low, and a read-out word line WL1 selected from the row address signal R1 goes high. The word lines WL1 and WL2 have the state of dual selection. The memory cell selected by the word line WL2 already stores the intermediate voltage VP, and therefore the read-out operation for the memory cell selected by the word line WL1 is not affected.

Read data RD is read from the memory cell selected by the word line WL1 onto the bit lines BL and /BL, on which a small voltage difference is created. At this time, cell information in the memory cell selected by the word line WL1 is corrupted. The master register 20 is connected to the bit lines BL and /BL, and latches the read data RD. The activation signal S8 is already high at this time, and the read data RD is fed into the sense amplifier 25, which is activated by the activation signal S9, thereby amplifying the read data RD.

The master register 20 is disconnected from the bit lines BL and /BL, and the slave register 22 is connected to the bit lines BL and /BL so that write-back data WD which has been read in the previous cycle and held in the slave register 22 is written back to the memory cell. This write-back operation takes place concurrently for the memory cells selected by the word lines WL1 and WL2.

Subsequently, the word line WL2 goes low, and the read data RD held in the master register 20 is latched as write-back data WD in the next cycle by the slave register 22 in response to the rise of the control signal /RAS.

The word line WL1 is continuously selected so that it works as a write-back word line in the next cycle, and the intermediate voltage VP is written to the memory cell selected by the word line WL1 in the same manner as the former cycle. Subsequently, a read-out word line, e.g., word line WL2, is selected, and the operation continues.

This scheme eliminates the need of lowering within the cycle the selected word line in each cycle, and accordingly is capable of shortening the time length t6 out of the inactive high-level period of the control signal /RAS much more than the preceding word line selection schemes. The resulting reduced read-out cycle time speeds up the read operation.

In addition, the circuit arrangement of this embodiment uses a smaller number of circuit elements and a smaller circuit area as compared with the word line multi-selection circuits of the preceding embodiments.

Figure 19:
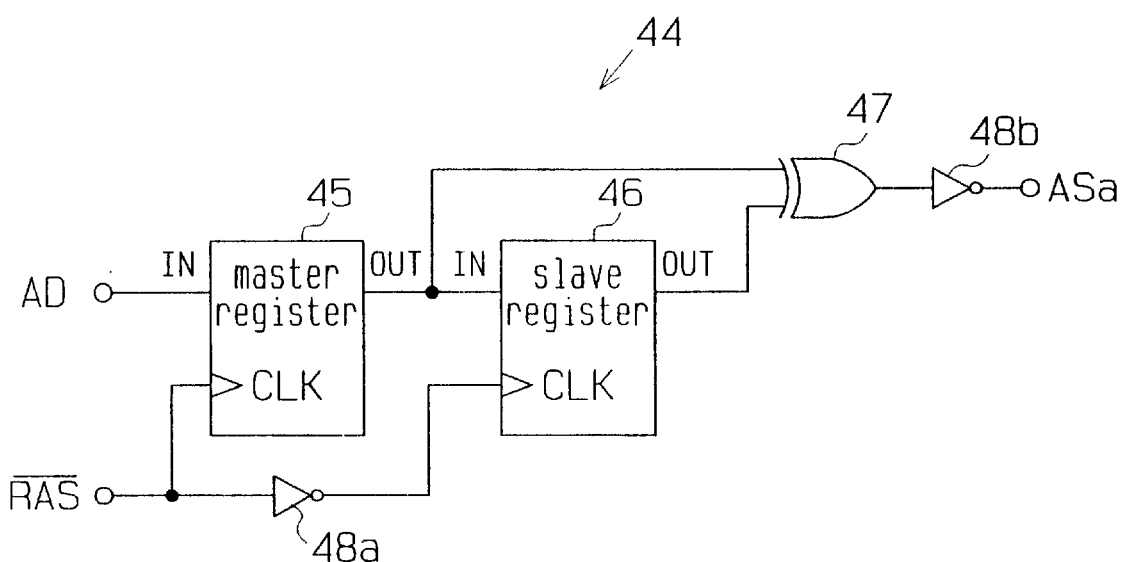
FIG. 19 is a schematic diagram of an address coincidence detection circuit according to the sixth embodiment.

The word line multi-selection circuit C4 of the sixth embodiment preferably has an address coincidence detection circuits 44 shown in FIG. 19. The address coincidence detection circuit 44 comprises a master register 45, a slave register 46, an exclusive-OR gate 47 and inverters 48a and 48b. The address signal AD is provided to the master register 45. The number of master resister 45 provided is equal in number to the number of bits of the address signal AD.

The address coincidence detection circuit 44 outputs a low-level output signal ASa indicative of the coincidence of addresses between the previous and current cycles, which produces the address coincidence signal in a short time.

Seventh Embodiment

Figure 20:
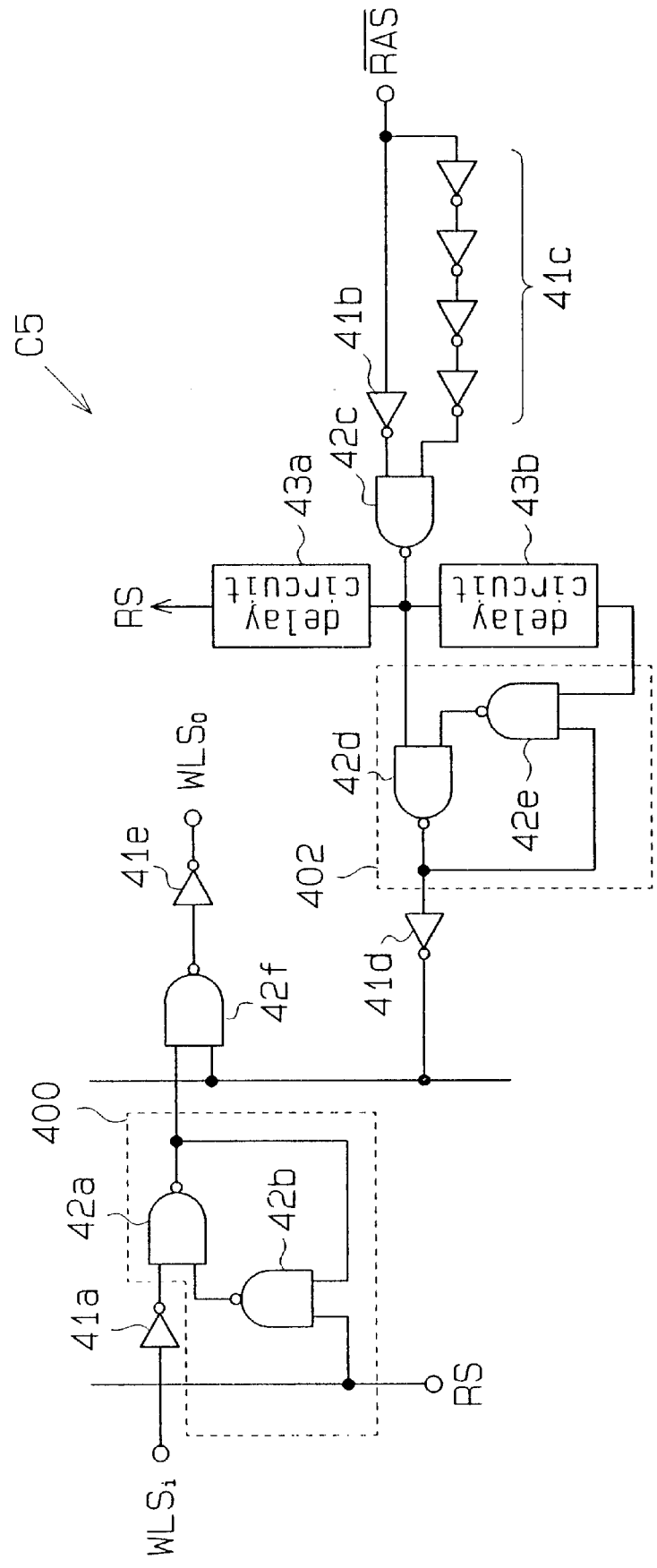
FIG. 20 is a schematic diagram of a word line multi-selection circuit according to a seventh embodiment of the present invention.

FIG. 20 shows a word line multi-selection circuit C5 based on a seventh embodiment of the present invention. The circuit C5 is derived from the sixth embodiment, and further includes a second delay circuit 43b, NAND gates 42d–42f and inverters 41d and 41e, which form a set signal generation circuit. A circuit section including the NAND gates 42d and 42e and inverter 41d is common to all of the word line multi-selection circuits C5. The NAND gates 42d and 42e form an RS flip-flop 402. The delay circuit 43b has its delay time set shorter than that of the first delay circuit 43a.

In the word line multi-selection circuit C5, when the control signal /RAS is high, the NAND gate 42d receives two high-level input signals, causing the inverter 41d to output a high-level output signal. When the control signal /RAS goes low and a high-level word line selecting signal WLSi is received, the output signal of the NAND gate 42a goes high and the word line selecting signal WLSo goes high.

Subsequently, a low-level pulse signal produced by the NAND gate 42c causes the NAND gate 42d to output a high level and the inverter 41d to output a low level. Consequently, the NAND gate 42f outputs a high-level output signal, and the word line selecting signal WLSo goes low. Subsequently, when the delay circuit 43b outputs a low-level pulse signal, the NAND gate 42d receives two high-level input signals, and the inverter 41d outputs a high-level output signal. Consequently, the NAND gate 42f receives two high-level input signals, and the word line selecting signal WLSo goes high. Subsequently, when the delay circuit 43a outputs a low-level pulse signal as reset signal RS, the NAND gate 42a receives two high-level input signals to output a low-level output signal, and the word line selecting signal WLSo goes low. Accordingly, the word line multi-selection circuit C5 of the seventh embodiment operates based on any of the first through fourth word line selection schemes depending on the setting of the delay times of the delay circuits 43a and 43b. The word line multi-selection circuit C5 effectuates the reduction of the number of circuit elements, reducing the circuit area, in addition to the effectiveness of the first through fourth word line selection schemes.

Eighth Embodiment

In an eighth embodiment, an address counter which generates the row address signal for the memory refresh operation is formed by the word line multi-selection circuits derived from the first through third embodiments.

Figure 21:
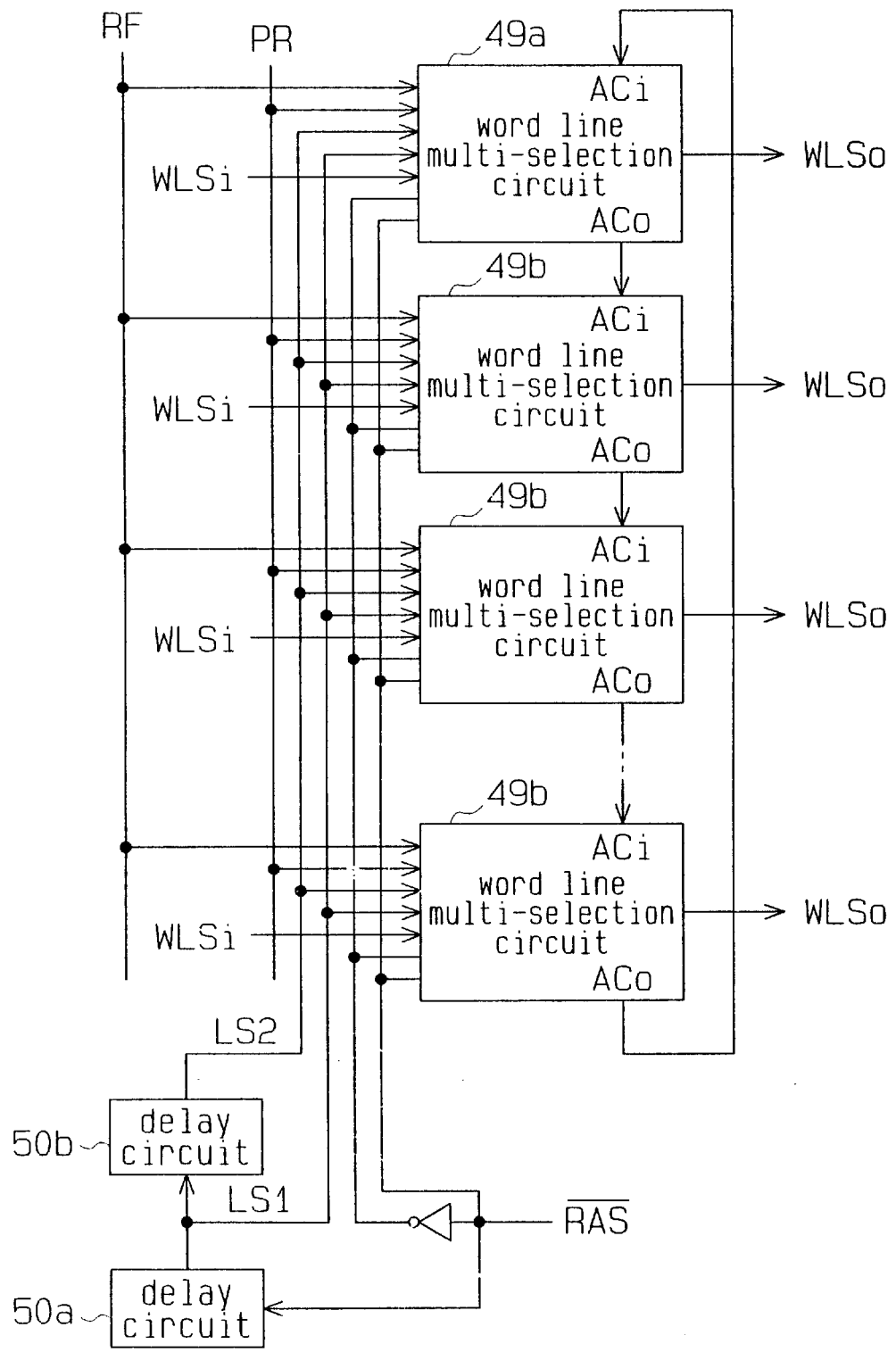
FIG. 21 is a schematic diagram of a word line multi-selection circuit based on a eighth embodiment of the present invention.

In FIG. 21, a plurality of word line multi-selection circuits 49a and 49b which produce the word line selecting signals WLSo receive the word line selecting signals WLSi from the row decoder and also receive the control signal /RAS and its inverted version RAS.

The word line multi-selection circuits 49a and 49b further receive the refresh signal RF which is high during the refresh operation and a power-on reset signal PR which goes high at the moment of power-on and output the word line selecting signals WLSo. The circuits 49a and 49b further receive a delayed control signal LS1 which is the control signal /RAS delayed by a delay circuit 50a, and a second delayed control signal LS2 which is the control signal /RAS delayed by the first delay circuit 50a and a second delay circuit 50b.

The word line multi-selection circuits 49a and 49b operate in unison as a ring counter in response to the refresh signal RF, in which each word line multi-selection circuit takes in an address count signal ACi, which is the address count signal ACo outputted from the word line multi-selection circuit of the former stage, in response to the fall of the control signal /RAS and outputs the received address count signal ACi as its output address count signal ACo in response to the next fall of the control signal /RAS.

Figure 22:
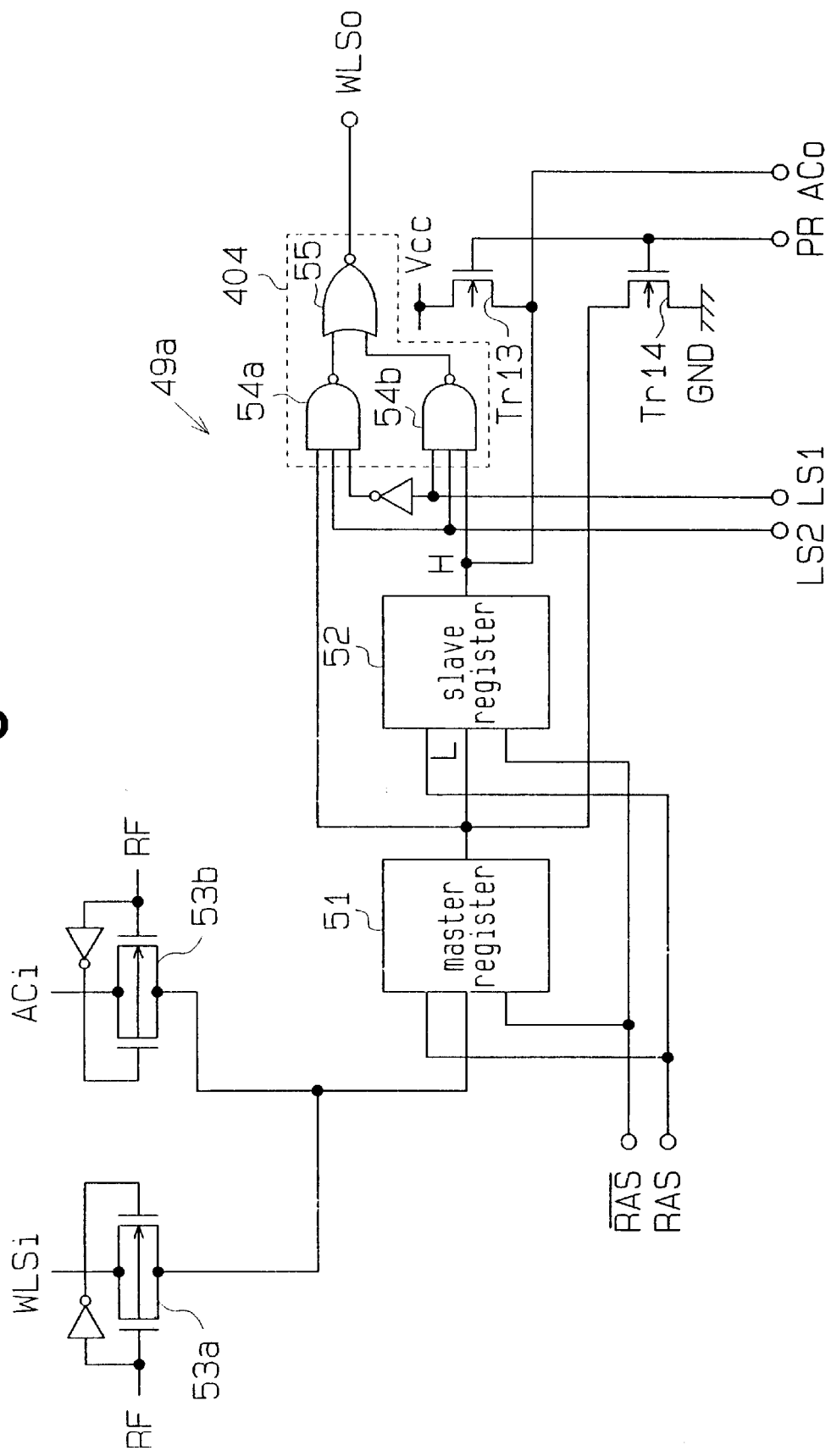
FIG. 22 is a more detailed schematic diagram of a portion of the word line multi-selection circuit according to the eighth embodiment of the present invention.

FIG. 22 shows a specific circuit arrangement of the word line multi-selection circuit 49a. The master register 51 and slave register 52 similar in arrangement to the first through third embodiments receive the control signals RAS and /RAS.

The master register 51 receives the word line selecting signal WLSi through a transfer gate 53a, which is conductive in response to a low-level refresh signal RF and is non-conductive in response to a high-level refresh signal RF. Accordingly, during the normal-mode operation, when the refresh signal RF goes low, the word line selecting signal WLSi is fed to the master register 51 through the transfer gate 53a.

The address count signal ACi is provided to the master register 51 through a transfer gate 53b, which is non-conductive in response to a low-level refresh signal RF and is conductive in response to a high-level refresh signal RF. Accordingly, during the refresh-mode operation, when the refresh signal RF goes high, the address count signal ACi is fed through the transfer gate 53b to the master register 51.

A multiplexer 404 is formed by NAND gates 54a and 54b and NOR gate 55. The output signal of the master register 51 is provided to the NAND gate 54a and the output signal of the slave register 52 is provided to the NAND gate 54b. The delayed signal LS1 is provided to the NAND gate 54b and an inverted version thereof is provided to the NAND gate 54a. The delayed signal LS2 is provided to the NAND gates 54a and 54b. Outputs of the NAND gate 54a and 54b are provided to the NOR gate 55, which then outputs the word line selecting signal WLSo.

The output signal of the slave register 52 is delivered as the address count signal ACo. The slave register 52 has its output terminal connected through an n-channel MOS transistor Tr13 to the high power voltage Vcc, while the master register 51 has its output terminal connected through an n-channel MOS transistor Tr14 to the ground (GND). The transistors Tr13 and Tr14 have their gates receiving the power-on reset signal PR.

Figure 23:
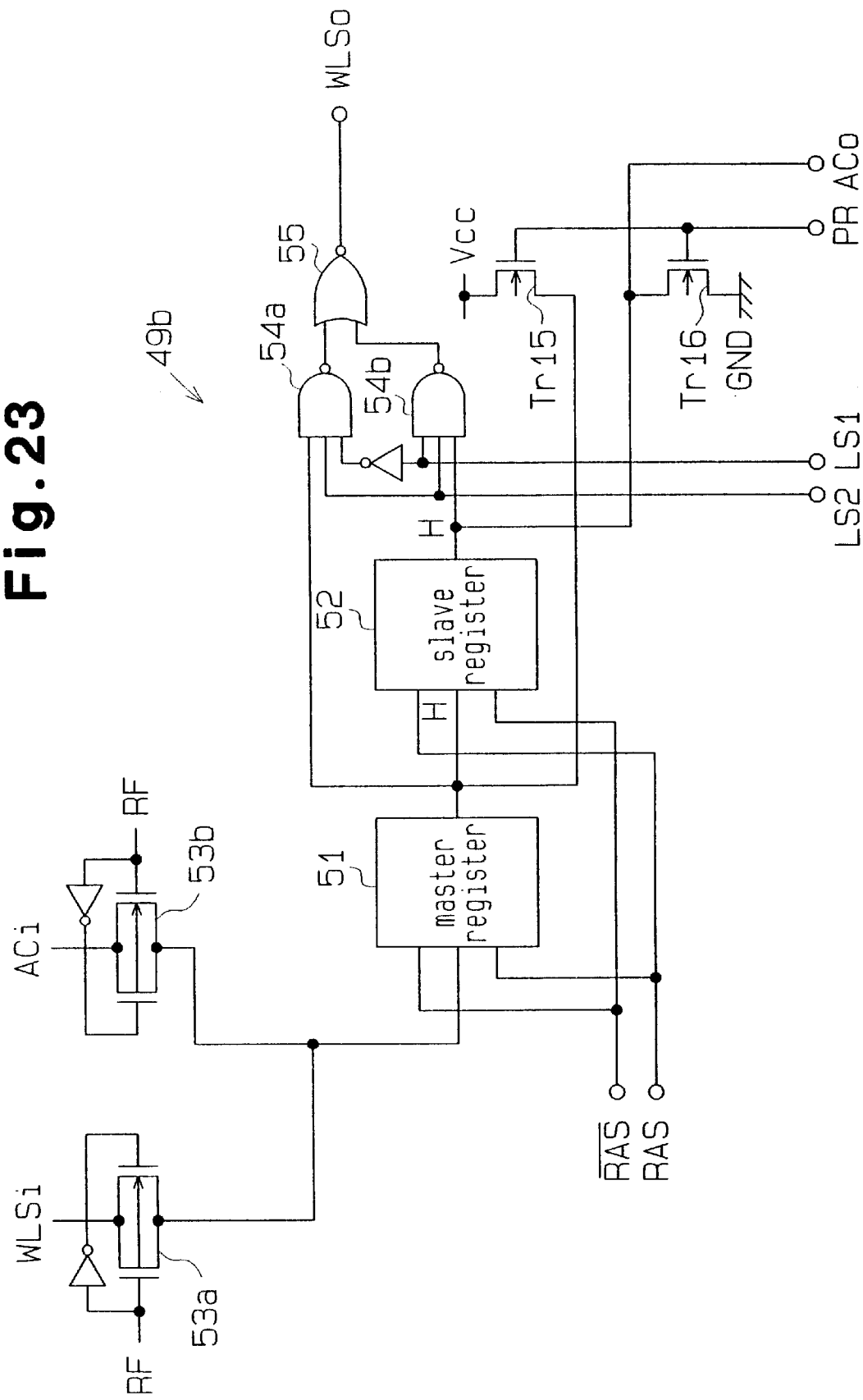
FIG. 23 is a more detailed schematic diagram of a portion of the word line multi-selection circuit according to the eighth embodiment of the present invention.

FIG. 23 shows a specific circuit arrangement of the word line multi-selection circuit 49b. The circuit 49b is identical to the word line multi-selection circuit 49a except that the master register 51 has its output terminal connected through an n-channel MOS transistor Tr15 to the high power voltage Vcc, the slave register 52 has its output terminal connected through an n-channel MOS transistor Tr16 to the ground (GND), and the master and slave registers 51 and 52 receive input control signals RAS and /RAS anti-phased relative to the circuit 49a.

In the word line multi-selection circuits 49a and 49b, when power is provided, the slave register 52 outputs a high-level output signal and the master register 51 outputs a low-level output signal in the circuit 49a, while the master register 51 and slave register 52 output high-level output signals in the circuit 49b.

During the normal-mode operation in which the refresh signal RF is low, the transfer gate 53a is conductive and the transfer gate 53b is non-conductive. The circuits 49a and 49b operate in response to the word line selecting signal WLSi and control signal /RAS in the same manner as the word line multi-selection circuits of the first through third embodiments, thereby performing the word line dual selecting operation.

During the refresh-mode operation in which the refresh signal RF is high, the transfer gate 53b is conductive and the transfer gate 53a is non-conductive. The circuits 49a and 49b operate in response to the input count signals ASi to output the word line selecting signals WLSo and the output signals of all slave registers 52 as output count signals ACo.

The word line multi-selection circuits 49a and 49b operate in unison as a ring counter, in which two adjoining circuits output high-level word line selecting signals WLSo sequentially at each fall of the control signal /RAS.

The word line multi-selection circuits of the eighth embodiment have the function of an address generation circuit for the memory refresh operation, and therefore it is possible to implement the memory self-refresh operation without operating the row decoder. Consequently, the memory refresh operation takes place fast and stably at a reduced power consumption.

Further, the eighth embodiment does not need to have a separate address generation circuit, and does not need to have a circuit for switching the input of the row decoder between the external address signal for the normal-mode operation and the address signal provided by the address generation circuit for the refresh-mode operation. Consequently, the address signal input is sped up and erroneous address input is prevented in the normal-mode operation.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details provided herein, but may be modified within the scope and equivalence of the appended claims.

What is claimed is:

1. A semiconductor memory device capable of reading cell information from a memory cell in a memory cell array associated with a selected one of a plurality of word lines within one cycle of an activated control signal, the device comprising:

a row decoder, responsive to the activated control signal and generating a word line selecting signal for selecting a read-out word line, the read-out word line used in a current cycle to read the cell information in accordance with a row address signal and for selecting a write-back word line, which has been used in a previous cycle to read cell information and used in the current cycle to write back cell information;

a register receiving the cell information read from the memory cell associated with the word line selecting signal and temporarily storing the read cell information, the register further writing, in the current cycle, the read cell information, which was stored in the register in the previous cycle, back to the memory cell associated with the selected write-back word line; and a sense amplifier circuit receiving the read cell information from the register and providing the read cell information as read-out data therefrom.

2. The semiconductor memory device according to claim 1, wherein the row decoder includes:

a row decode circuit for receiving the row address signal and generating the word line selecting signal in accordance with the row address signal; and a word line multi-selection circuit, provided for each word line, receiving the word line selecting signal from the row decode circuit and generating one of a read-out word line selection signal selecting the read-out word line and a write back word line selection signal selecting the write-back word line.

3. The semiconductor memory device according to claim 2, wherein the word line multi-selection circuit includes:

a master register latching the word line selecting signal in response to an inactive control signal;

a slave register, coupled to the master register, latching the word line selecting signal output from the master register in response to the activated control signal; and a multiplexer, coupled to the master register and the slave register, wherein in the current cycle, the multiplexer outputs the word line selecting signal outputted from the master register as the read-out word line selecting signal and in a next cycle, outputs the word line selecting signal latched by the slave register, as the write-back word line selecting signal.

4. The semiconductor memory device according to claim 3, wherein the word line multi-selection circuit further includes a delay circuit receiving the control signal and outputting a delayed control signal, wherein the multiplexer outputs within one cycle of the activated control signal the write-back word line selection signal in response to the delayed control signal after outputting the read-out word line selection signal.

5. The semiconductor memory device according to claim 4, wherein the read-out and write-back word line selection signals are duplicated in one cycle.

6. The semiconductor memory device according to claim 3, wherein the word line multi-selection circuit further includes a delay circuit receiving the control signal and outputs a delayed control signal, wherein the multiplexer outputs within one cycle of the activated control signal the write-back word line selection signal in response to the delayed control signal following outputting of the read-out word line selection signal.

7. The semiconductor memory device according to claim 3, wherein the word line multi-selection circuit further includes a delay circuit receiving the control signal and outputs a delayed control signal, wherein the multiplexer outputs within one cycle of the activated control signal the read-out word line selection signal in response to the delayed control signal following outputting of the write-back word line selection signal.

8. The semiconductor memory device according to claim 2, wherein the word line multi-selection circuit includes:

an RS flip-flop circuit receiving the word line selecting signal and outputting the word line selecting signal as the read-out word line selecting signal in the current cycle; and a reset signal generation circuit generating the reset signal in response to a transition of the control signal and outputting the reset signal in a next cycle to the RS flip-flop circuit so that the RS flip-flop circuit outputs the word line selecting signal as the write-back word line selecting signal in the next cycle until the reset signal is received by the RS flip-flop circuit.

9. The semiconductor memory device according to claim 8, wherein the word line multi-selection circuit further includes a word line coincidence detection circuit detecting the coincidence between the row address signals in the previous cycle and the current cycle and outputting a preclusion signal for precluding the reading of cell information from the memory call in the current cycle.

10. The semiconductor memory device according to claim 2, wherein the word line multi-selection circuit includes a word line coincidence detection circuit detecting the coincidence between the read-out and write-back word line selection signals in both the previous and current cycles and outputting a preclusion signal for precluding the reading of cell information from the memory call in the current cycle.

11. The semiconductor memory device according to claim 2, wherein the word line multi-selection circuit includes:

an RS flip-flop circuit receiving the word line selecting signal and outputting the word line selecting signal as the read-out word line selecting signal in the current cycle;

a reset signal generation circuit generating a reset signal in response to a transition of the control signal and outputting the reset signal in a next cycle to the RS flip-flop circuit so that the RS flip-flop circuit outputs the word line selecting signal as the write-back word line selecting signal in the next cycle until the reset signal is received; and a set signal generation circuit, coupled to the RS flip-flop circuit and the reset signal generation circuit, inverting the word line selecting signal from the RS flip-flop circuit prior to the outputting of the reset signal in response to the transition of the control signal and reinverting the inverted word line selecting signal on expiration of a predetermined time.

12. The semiconductor memory device according to claim 1, wherein the row decoder includes a row decode circuit for receiving the row address signal and generating the word line selecting signal in accordance with the row address signal, the row decode circuit further including:

an intermediate stage which produces an intermediate decode signal from the row address signal; and a word line multi-selection circuit receiving the intermediate decode signal from the intermediate stage, generating a first intermediate decode signal for selecting the read-out word line, and generating a second intermediate decode signal for selecting the write-back word line.

13. The semiconductor memory device according to claim 12, wherein the word line multi-selection circuit includes:

a master register latching the intermediate decode signal in response to the inactive control signal;

a slave register, coupled to the master register, latching the intermediate decode signal output from the master register in response to the activated control signal; and a multiplexer, coupled to the master and slave register, wherein in the current cycle, the multiplexer outputs the first intermediate decode signal latched by the master register and in a next cycle, outputs the second intermediate decode signal latched by the slave register.

14. The semiconductor memory device according to claim 12, wherein the word line multi-selection circuit includes a word line coincidence detection circuit detecting the coincidence between the intermediate decode signals in the previous cycle and current cycle and outputting a preclusion signal for precluding the reading of cell information from the memory cell in the current cycle.

15. The semiconductor memory device according to claim 1, wherein the row decoder includes:
a word line multi-selection circuit generating a first address signal for selecting the read-out word line and generating a second address signal for selecting the write-back word line; and
a row decode circuit for receiving the first row address signal and generating a read-out word line selection signal, the row decode circuit further receiving the second row address signal and generating a write-back word line selection signal.

16. The semiconductor memory device according to claim 15, wherein the word line multi-selection circuit includes:
a master register latching the row address signal in response to the inactive control signal;
a slave register, coupled to the master register, latching the row address signal output from the master register in response to the activated control signal; and
a multiplexer, coupled to the master register and slave register, wherein in the current cycle, the multiplexer outputs the first row address signal and in a next cycle, the multiplexer outputs the second row address signal latched by the slave register.

17. The semiconductor memory device according to claim 15, wherein the word line multi-selection circuit includes a word line coincidence detection circuit detecting the coincidence between the address signals in the previous cycle and current cycle and outputting a preclusion signal for precluding the reading of cell information from the memory call in the current cycle.

18. The semiconductor memory device according to claim 1, wherein the row decoder includes a plurality of word line multi-selection circuits connected in a ring configuration so that each of the plurality of word line multi-selection circuits selects the read-out and write-back word lines sequentially in response to the control signal.

19. The semiconductor memory device according to claim 18, wherein each of the word line multi-selection circuits includes:
a master register latching the word line selecting signal in response to the control signal being inactive;
a slave register, coupled to the master register, latching the word line selecting signal output from the master register in response to the activated control signal; and
a multiplexer, coupled to the master register and slave register, wherein in the current cycle, the multiplexer outputs the word line selecting latched by the master register as the read-out word line selecting signal and in a next cycle, outputs the word line selecting signal latched by the slave register in a previous cycle, as a write-back word line selecting signal, and
wherein a first one of the word line multi-selection circuits provides the word line selecting signal of the slave register to the master register of a second one of the word line multi-selection circuits in response to a refresh signal.

20. The semiconductor memory device according to claim 1, wherein the register includes:
a master register latching the cell information read from the memory cell selected by the read-out word line and providing the cell information to the sense amplifier circuit; and
a slave register latching the cell information from the master register to write the latched cell information back to the memory cell selected by the write-back word line.

21. The semiconductor memory device according to claim 20, wherein the master and slave registers are connected to bit lines, and wherein the master register latches in the current cycle cell information which has been read onto the bit lines from the memory cell associated with the read-out word line and transfers the latched cell information to the slave register at the end of the current cycle and the cell information latched by the slave register is written in the next cycle back to the memory cell associated with the write-back word line via the bit lines.

22. The semiconductor memory device according to claim 20, wherein the master and slave registers are connected to bit lines, the row decoder selects in the current cycle the write-back word line prior to the end of selection of a read-out word line, and the register is disconnected from the bit lines prior to the selection of the write-back word line and subsequently the slave register is connected to the bit lines.

23. The semiconductor memory device according to claim 20, wherein the master and slave registers are connected to bit lines, the row decoder selects in the current cycle the write-back word line prior to the end of selection of a read-out word line, and a precharge voltage is provided to the memory cell associated with the write-back word line via the bit lines.

24. The semiconductor memory device according to claim 20, wherein the register includes a refresh register, connected to bit lines, for refreshing cell information.

25. The semiconductor memory device according to claim 20, wherein the slave register includes a refresh register for refreshing cell information.

26. A memory device comprising:
a memory cell array including a plurality of memory cells containing information;
a row decoder for generating a word line selecting signal for selecting a read-out word line, the read-out word line used in a current cycle to read the cell information from a selected one of the plurality of memory cells, and for selecting a write-back word line, the write-back word line having been used in a previous cycle to read cell information from a previous selected one of the plurality of memory cells, to write-back cell information back into the previously selected memory cell;
a word line multi-selection circuit receiving the word line selecting signal and generating a read-out word line selection signal selecting the read-out word line and a write-back word line selection signal selecting the write-back word line; and
a register receiving and storing the cell information read in the current cycle and writing back to the memory cell read in the previous cycle, the cell information read in the previous cycle, as specified by the write-back word line.

27. A semiconductor memory device comprising:
a row decoder generating a word line selecting signal for selecting a read-out word line, the read-out word line used in a current cycle to read a cell information in accordance with a row address signal and for selecting a write-back word line, which has been used in a previous cycle to read cell information and used in the current cycle to write back cell information.

* * * * *